US010853551B1

(12) United States Patent
Jaklic

(10) Patent No.: US 10,853,551 B1
(45) Date of Patent: Dec. 1, 2020

(54) SYSTEM AND METHOD FOR OFFSETTING AND SMOOTHING OF PLANAR REGION BOUNDARIES DEFINED BY ARBITRARY PARAMETRIC CURVES

(71) Applicant: Cadence Design Systems, Inc., San Jose, CA (US)

(72) Inventor: Janez Jaklic, Feldkirchen (DE)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/165,961

(22) Filed: Oct. 19, 2018

(51) Int. Cl.
 G06F 17/50 (2006.01)
 G06F 30/39 (2020.01)
 H01L 27/02 (2006.01)

(52) U.S. Cl.
 CPC .......... *G06F 30/39* (2020.01); *H01L 27/0207* (2013.01)

(58) Field of Classification Search
 USPC .................. 716/101, 102, 51, 52, 53, 54, 55
 See application file for complete search history.

(56) References Cited

U.S. PATENT DOCUMENTS

| 7,346,886 | B2 * | 3/2008 | Fukagawa | G03F 7/70433 |
| | | | | 716/50 |
| 2003/0065494 | A1 | 4/2003 | Croix | |
| 2003/0083764 | A1 * | 5/2003 | Hong | G05B 19/40932 |
| | | | | 700/98 |
| 2004/0024575 | A1 * | 2/2004 | Surazhsky | G06T 3/0093 |
| | | | | 703/2 |
| 2006/0230365 | A1 * | 10/2006 | Bromberger | G06F 30/36 |
| | | | | 716/115 |
| 2007/0226668 | A1 * | 9/2007 | Dasdan | G06F 30/3312 |
| | | | | 716/108 |
| 2008/0024499 | A1 | 1/2008 | Bateman | |
| 2009/0324093 | A1 | 12/2009 | Miarecki et al. | |
| 2011/0022219 | A1 * | 1/2011 | Saied | G03F 1/36 |
| | | | | 700/121 |
| 2012/0017193 | A1 * | 1/2012 | Ou | G06F 30/39 |
| | | | | 716/129 |
| 2014/0321165 | A1 * | 10/2014 | Albea Sanchez | G06F 1/3206 |
| | | | | 363/1 |
| 2018/0239860 | A1 | 8/2018 | Allen | |

OTHER PUBLICATIONS

Li, W., et al., "Global Topological Changes of Offset Domains", 2011 Eigth International Symposium on Voronoi Diagrams in Science and Engineering, IEEE, pp. 83-90.

* cited by examiner

*Primary Examiner* — Brian Ngo
(74) *Attorney, Agent, or Firm* — Vista IP Law Group, LLP

(57) ABSTRACT

According to an aspect of this disclosure, a computer-implemented method of offsetting boundary curves includes providing a plurality of inputs for an identified boundary set, developing an offset distance, and creating an offset boundary curve for each boundary. The method of offsetting boundary curves further includes determining intersection points of each of the offset boundary curves, assigning a node to each of the intersection points, and determining sections between intersection points for each offset curve. Still further this method includes determining a minimum distance between sections, wherein when the sections are nearer one another than the minimum distance the sections are determined to belong to the same node and combining the offset boundary curves to define a set of offset boundary curves.

20 Claims, 14 Drawing Sheets

SYSTEM AND METHOD FOR OFFSETTING AND SMOOTHING OF PLANAR REGION BOUNDARIES DEFINED BY ARBITRARY PARAMETRIC CURVES

FIELD OF THE DISCLOSURE

Embodiments described herein are generally related to the field of physical layout for integrated circuit (IC) design and computer aided design. More specifically, embodiments described herein are related to developing offset curves and smoothing of offset boundary lines

BACKGROUND

The present disclosure describes a system and method for offsetting and/or smoothing of planar region boundaries comprising arbitrary parametric boundary curves.

In the fields of integrated circuit (IC) design, computer aided design (CAD), computer aided manufacturing (CAM), lithographic mask generation, laser etching and engraving, electronic design automation (EDA), and other fabrication techniques represent a number of suitable applications for curve offsetting and boundary smoothing. Curve offsetting for sizing of polygons may be applied in electronic design automation of lithographic mask generation. Curve offsetting is often applied to the classes of curves commonly used in CAD, CAM, and EDA systems. These common classes of curves include lines, conic sections (e.g. circular and elliptic arcs), and polynomial splines.

In particular applications, however, the use of more general classes of curves is desirable. For example, the geometries of silicon photonics, micro-electro-mechanical systems (MEMS), optical waveguides, and microfluidics devices may be the result of a mathematical solution representing some underlying physical model. Therefore, these underlying physical models are often naturally described with curves given by arbitrary parametric functions. The present disclosure represents an improvement in the state of the art by describing a more general method for curve offsetting that addresses parametric functions and that may address many classes of curve functions.

The description provided in the background section should not be assumed prior art merely because it is mentioned in or associated with the background section. The background section may include information that describes one or more aspects of the subject technology.

SUMMARY

According to an aspect of this disclosure, a computer-implemented method of offsetting boundary curves includes providing a plurality of inputs for an identified boundary set, developing an offset distance, and creating an offset boundary curve for each boundary. The method of offsetting boundary curves further includes determining intersections of each of the offset boundary curves, assigning a node to each intersection point, and determining sections between intersection points for each offset curve. Still further this method includes determining a minimum distance between sections, wherein when the sections are nearer one another than the minimum distance the sections are determined to belong to the same node and combining the offset boundary curves to define a set of offset boundary curves.

According to another aspect of the present disclosure, a system includes a memory storing instructions and a processor configured to execute the instructions such that the system provides an identified boundary set comprising a plurality of boundary curves, develops a target minimum offset distance $D_{min}$ and a target minimum offset width $W_{min}$, and creates an offset boundary curve for each boundary curve of the plurality of boundary curves. Still further, the system performs a smoothing operation on the offset boundary curves and combines the offset boundary curves to define a set of offset boundary curves.

According to yet another aspect of this disclosure, a non-transitory machine-readable storage medium comprises machine-readable instructions for causing a processor to execute a method that includes steps of providing a plurality of inputs for an identified boundary set, the plurality of inputs comprising: providing an identified boundary set comprising a plurality of boundary curves, and developing a target minimum offset distance $D_{min}$ and a target minimum offset width $W_{min}$. The steps stored on this medium also include creating an offset boundary curve for each boundary curve of the plurality of boundary curves, smoothing the offset boundary curves, and combining the offset boundary curves to define a set of offset boundary curves.

BRIEF DESCRIPTION OF THE DRAWINGS

The accompanying drawings, which are included to provide further understanding and are incorporated in and constitute a part of this specification, illustrate disclosed embodiments, and together with the description, serve to explain the principles of the disclosed embodiments.

In the drawings.

Figure 1A:
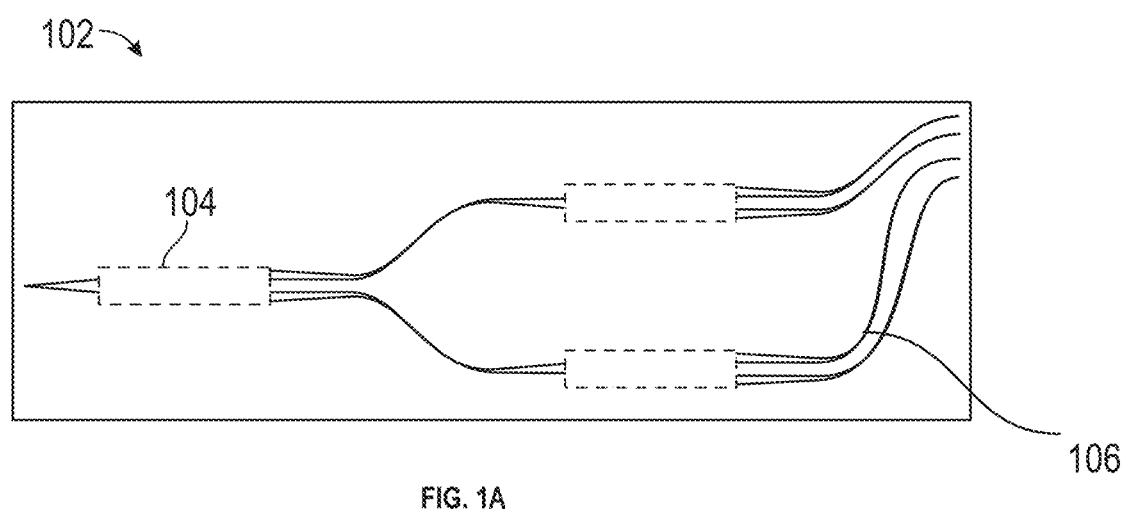
FIG. 1A illustrates a schematic of an IC design, according to example embodiments.

In the figures, elements and steps denoted by the same or similar reference numerals are associated with the same or similar elements and steps, unless indicated otherwise. In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and descriptions are to be regarded as illustrative in nature and not restrictive.

The present disclosure describes a system and method for offsetting and/or smoothing of planar region boundaries comprising arbitrary parametric boundary curves.

In the fields of integrated circuit design, computer aided design (CAD), computer aided manufacturing (CAM), lithographic mask generation, laser etching and engraving, electronic design automation (EDA), and other fabrication techniques represent a number of suitable applications for curve offsetting and boundary smoothing. Curve offsetting for sizing of polygons may be applied in electronic design automation of lithographic mask generation. Curve offsetting is often applied to the classes of curves commonly used in CAD, CAM, and EDA systems. These common classes of curves include lines, conic sections (e.g. circular and elliptic arcs), and polynomial splines.

In particular applications, however, the use of more general classes of curves is desirable. For example, the geometries of silicon photonics, micro-electro-mechanical systems (MEMS), optical waveguides, and microfluidics devices may be the result of a mathematical solution representing some underlying physical model. Therefore, these underlying physical models are often naturally described with curves given by arbitrary parametric functions. An improvement in the state of the art is represented by a more general method for curve offsetting for addressing these parametric functions and that may address many classes of curve functions.

The system and method that are the subject of this disclosure comprise offsetting of curves described by arbitrary parametric functions. In an example, the set of curves to be offset forms a boundary of a simply connected region. This example is applicable to methods for the generation of lithographic masks.

Example embodiments also describe offsetting for smoothing of boundaries according to target maximum convex and concave curvature(s) and for merging and splitting of boundaries to remove narrow gaps between the boundaries and narrow regions within the boundaries. This example method and system uses techniques for finding intersections of curves based on a method for error-controlled discretization of said curves and symbolic algebra to compute the derivatives of the curve functions. It may be desirable to provide a system and/or method for checking the minimum width and the minimum distance of planar region boundaries defined by arbitrary parametric curves, while also checking the maximum positive (convex) curvature and the minimum negative (concave) curvature, respectively, of the boundary curves.

The disclosed system addresses a technical problem tied to computer technology and arising in the realm of computer aided design and design automation performed by computers. Namely the technical problem of developing curve offsets and smoothing boundary lines of components represented in computer aided design such as for IC design and/or lithographic mask design. The disclosed system solves these problems by checking minimum width, minimum distance, and maximum curvature of curved boundaries based on the relatively precise representation thereof by parametric curves in symbolic form. This system/method is an improvement over approximating curved boundaries with numerous polygons according to conventional methods. Example embodiments consistent with the present disclosure also provide a system/method for smoothing boundaries represented by parametric curves by finding intersections of curves based on a method for error-controlled discretization of said curves and symbolic algebra to compute the derivatives of the curve functions.

Example embodiments of the system/method as disclosed herein significantly enhance the performance of a computer by increasing the accuracy of calculations and designs respectively performed and developed by said computer. Further, example embodiments enhance the performance of the computer by facilitating the more accurate mathematical representation of parametric curve boundaries by programs executed by a computer for the purpose of computer aided design, lithographic mask design, IC design, etc.

FIG. 1A illustrates a schematic of an IC design 102 on which the example system/method 100 (FIGS. 24 and 25) may operate. IC design 102 may include one or more connected and/or proximal circuit and/or waveguide components. In general, the component(s) 104 may include complex and problematic components for the IC design 102, such as, for example, silicon photonics, MEMS, waveguides, and microfluidics devices, as noted hereinabove. Circuit components 104 may also include metal-oxide-semiconductor field effect (MOSFET) transistors, N-type MOS (NMOS) transistors, P-type MOS transistors (PMOS), resistors, capacitors, inductors, and/or other suitable components. Parameters relevant for IC design 102 may include, without limitation, minimum width and minimum distance of shapes, maximum convex curvature, and minimum concave curvature. Accordingly, a user may be interested in modeling the IC design 102 according to the highest density of components possible within a specified and/or minimized amount of substrate area, while avoiding overlapping of the component(s) 104. For example, the IC design 102 shows a physical layout of a photonic circuit and example curved waveguide paths 106 that increase the complexity of IC design.

In the subject disclosure, curves may be defined in parametric form:

$$c = \{r(t) = (x(t), y(t)), t_1 \leq t \leq t_2\} \quad (1),$$

where r is a point on the curve in the plane with coordinates (x, y) and parameter t takes values on the interval $[t_1, t_2]$. Each curve has an associated orientation o(c) with two possible values ±1 determining the parameter $t_F$ (C) of the first point $r(t_F(C))$ on the curve and the parameter $t_L(c)$ of the last point $r(t_L(c))$ on the curve:

$$t_F(c) = \frac{t_1 + t_2}{2} + o(c)\frac{t_1 - t_2}{2}$$

$$t_L(c) = \frac{t_1 + t_2}{2} - o(c)\frac{t_1 - t_2}{2}.$$

Here and in the following, it is assumed that the curve functions in (1) are analytical and thus infinitely differentiable. The curve tangent vector is defined by:

$$T(r(t)) = \frac{o(c)}{\sqrt{x'(t)^2 + y'(t)^2}}(x'(t), y'(t)), \quad (2)$$

so that it changes the orientation when the orientation of the curve changes. The signed curvature of the curve (1) is given by $$\kappa(r(t)) = o(c)\frac{x'(t)y''(t) - y'(t)x''(t)}{\sqrt{(x'(t)^2 + y'(t)^2)^3}}. \quad (3)$$

The curvature is positive if the tangent vector is rotating counter-clockwise when the point on the curve is moving from the first to the last point of the curve. Likewise, the curvature is negative if the tangent vector is rotating clockwise when the point on the curve is moving from the first to the last point of the curve.

The boundary B(R) delineating the region R is defined as a list of N oriented curves:

$$B(R) = \{c_1, \ldots, c_i, \ldots, c_N\} \quad (4)$$

$$c_i = \{r_i(t) = (x_i(t), y_i(t)), t \in [t_{i1}, t_{i2}]\}$$

connected together such that the last point of each curve coincides with the first point of the next curve and that the last point of the last curve coincides with the first point of the first curve, as follows:

$$r_i(t_L(c_i)) = r_{i+1}(t_F(c_{i+1})) \quad i = 1, \ldots, N-1$$

$$r_N(t_L(c_N)) = r_1(t_F(c_1)).$$

The subject technology allows for the case N=1 where the boundary consists of a single curve forming a loop. The curves are assumed not to intersect with other curves and also not with themselves, except at the first and the last point whereat each curve is connected to the next curve in the list, or to itself in case N=1. Thus the region R enclosed by the boundary B(R) is always simply connected. The area A(B(R)) of the region R enclosed by the boundary B(R) is defined by:

$$A(B(R)) = \frac{1}{2}\sum_{i=1}^{N}\int_{t_{i1}}^{t_{i2}}\left(x_i(t)\frac{dy_i(t)}{dt} - y_i(t)\frac{dx_i(t)}{dt}\right)dt. \quad (5)$$

The region R enclosed by the boundary B(R) is defined differently depending on the value of A(B(R)). If the area A(B(R)) is positive, the boundary B(R) is oriented counter-clockwise and the region R is defined to lie on the left side of the tangent vector T $(r_i(t))$ on each curve. Otherwise, if the area A(B(R)) is negative, the boundary B(R) is oriented clockwise and the region R is defined to lie on the right side of the tangent vector T $(r_i(t))$ on each curve. The regions with negative area are called holes.

Region set R is defined as a set of disjoint regions without any common points $$R = \{R_i\}, i \neq j \Leftrightarrow R_i \cap R_j = \emptyset \quad (6).$$

Boundary set B(R) is defined as a set of boundaries of the regions from the region set R $$B(R) = \{B(R_i), R_i \in R\} \quad (7).$$

Since the regions in R are disjoint, the boundaries inside the boundary set B(R) are also disjoint.

Vertex points $c_{ij}$ are defined as those points where two different curves $c_i$ and $c_j$ belonging to the same boundary coincide:

$$c_{ij} = r_i(t_{i2}) = r_j(t_{j1}) \quad (8),$$

where either j=i+1 or i=N and j=1. The vertex angle is defined by $$\Delta\phi_{ij} = P\angle(t(r_i(t_{i2}), T(r_j(t_{j1}))) \quad (9),$$

where P denotes the principal value of the angle such that $-\pi < \Delta\phi_{ij} \leq \pi$. The vertex is convex if $\Delta\phi_{ij} > 0$ and concave if $\Delta\phi_{ij} < 0$.

The offset curve $\bar{c}$ of the curve c expressed by equation (1) is defined as the parallel curve obtained by translating each curve point by the offset distance D in the direction of the normal vector to the curve, which is equal to the tangent vector of the curve rotated by $-\pi/2$:

$$\bar{c} = \{\bar{r}(t) = (\bar{x}(t), \bar{y}(t)), t_1 \leq t \leq t_2\}$$

$$\bar{x}(t) = x(t) + D\frac{y'(t)}{\sqrt{x'(t)^2 + y'(t)^2}} \quad (10)$$

$$\bar{y}(t) = y(t) - D\frac{x'(t)}{\sqrt{x'(t)^2 + y'(t)^2}}. \quad (11)$$

The orientation of the offset curve is defined to be the same as the orientation of the original curve $o(c) = o(\bar{c})$.

Figure 1B:
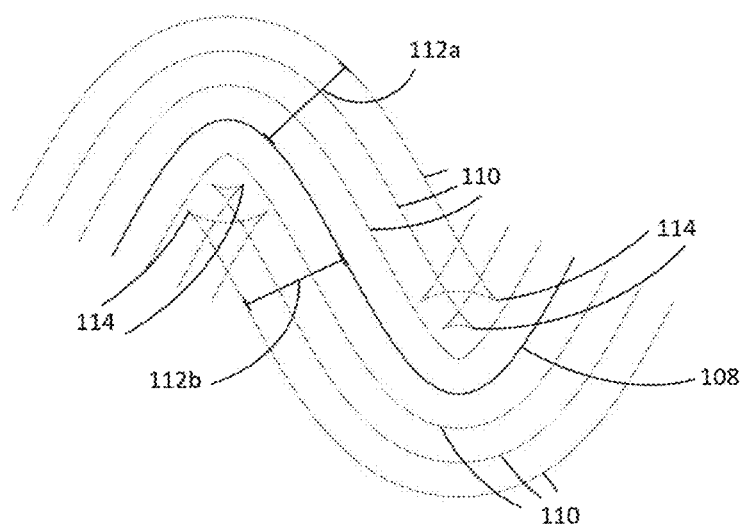
FIG. 1B illustrates a sine curve and the offset curves obtained from same for different positive and negative values of the offset distance, according to example embodiments.

FIG. 1B shows one period of a sine curve 108 and offset curves 110a, 110b obtained from the sine curve 108 for increasingly positive and negative values, respectively, of an offset distance 112. The tangent vector of the offset curve $T(\bar{r}(t))$ is always parallel to the tangent vector T (r(t)). Its direction depends on the sign of the curvature of the offset curve 110a, 110b which is given by:

$$\bar{\kappa}(t) = \frac{\kappa(t)}{1 + D\kappa(t)}. \quad (12)$$

The tangent vectors have the same direction when $\kappa(t)<-1/D$, i.e. when $\kappa(t)$ and $\bar{\kappa}(t)$ have the same sign, and opposite direction when $\kappa(t)>-1/D$, i.e. when $\kappa(t)$ and $\bar{\kappa}(t)$ have opposite signs. At points where $\kappa(t)=-1/D$, the tangent vector changes the direction discontinuously and the offset curves 110a, 110b exhibit cusps 114. At each pair of cusp points, the tangent vector on the curve section between the cusp points has the opposite direction than the tangent vectors of the two curve sections before and after the cusp point. The two curve sections before and after the cusp points may therefore intersect, thus resulting in the intersections of the offset curve 110a, 110b with itself.

The offset curve 110a, 110b can also be defined for vertex points in two cases:
for convex vertex points with $\Delta\varphi_{ij}>0$, when D>0; and
for concave vertex points with $\Delta\varphi_{ij}<0$, when D<0.
The offset vertex point of the vertex point $c_{ij}$ with coordinates $x_{ij}=x_i(t_{i2})=x_j(t_{j1})$ and $y_{ij}=y_i(t_{i2})=y_j(t_{j1})$ is defined as a circular arc $\bar{c}_{i,j}$ with the orientation and the angle such that it connects the last point $\bar{c}_i(t_{i2})$ of the offset curve of $c_i$ with the first point $\bar{c}_j(t_{j1})$ of the offset curve of $c_j$:

$$\bar{c}_{ij} = \{(x_{ij} + D\cos(t), y_{ij} + D\sin(t)), \quad (13)$$

$$\min(\phi_i, \phi_i + |\Delta\phi_{ij}|) \leq t \leq \max(\phi_i, \phi_i + |\Delta\phi_{ij}|)\}$$

$$\phi_i = \angle(x, T(r_i(t_{i2})) - \pi/2$$

$$\Delta\phi_{ij} = \angle(T(r_i(t_{i2})), T(r_j(t_{j1})))$$

$$o(\bar{c}_{i,j}) = D/|D|.$$

The set of offset boundary curves $\bar{B}'(R)$ of the boundary B(R), Eq. (4) are defined as a list of curves derived by offsetting each curve and each vertex point of the boundary B(R):

$$\bar{B}'(R)=\{\bar{c}_1, \bar{c}_{12}, \ldots, \bar{c}_{i-1,i}, \bar{c}_{i,i+1}, \ldots, \bar{c}_N\} \quad (14).$$

The offset boundary curve set $\bar{B}'$ of the boundary set B={B(R)} is defined as the union of all offset boundary curves of all boundaries contained in the elements of B $$\bar{B}' = \bigcup_{B(R)\in B} \bar{B}'(R). \quad (15)$$

Figure 2:
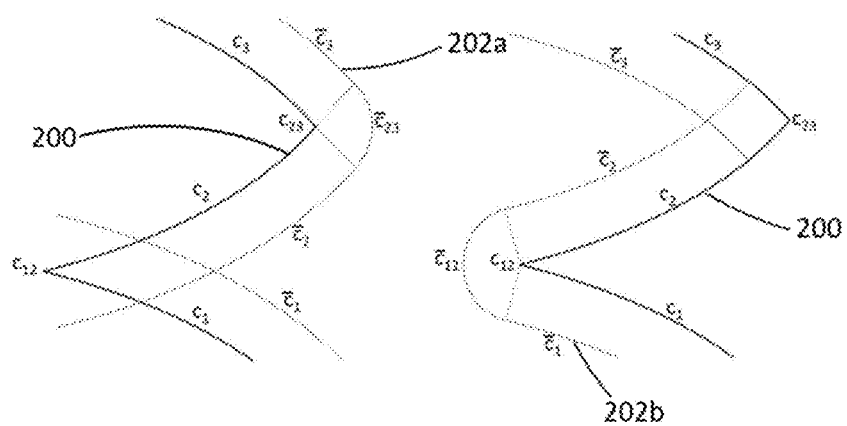
FIG. 2 shows the offset boundary curves for a positive and a negative value of offset distance D.

FIG. 2 shows another example boundary curve 200 and offset boundary curves 202a, 202b for a positive and a negative value of offset distance D, respectively. The boundary 200 is composed of elliptic arcs $c_1$, $c_2$, $c_3$, concave vertex point $c_{12}$ and convex vertex point $c_{23}$. The set of offset boundary curves 202a, 202b comprise the offset curves $\bar{c}_1$, $\bar{c}_2$, $\bar{c}_3$ and the offset curve $\bar{c}_{23}$ in case D>0, and the offset curve $\bar{c}_{12}$ in case D<0, respectively.

Figure 3:
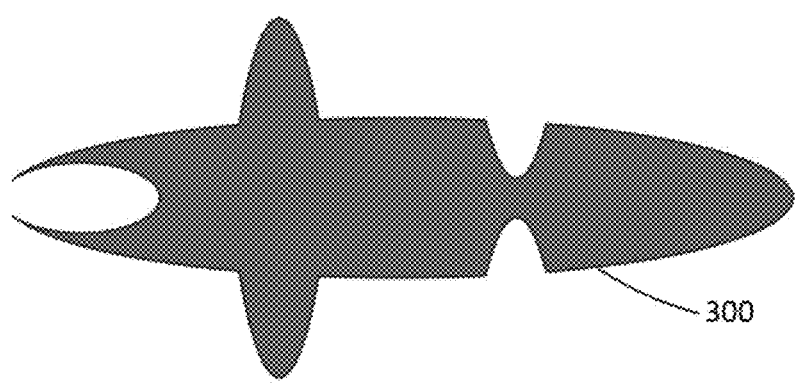
FIG. 3 illustrates an original boundary comprising elliptic arcs.
Figure 4:
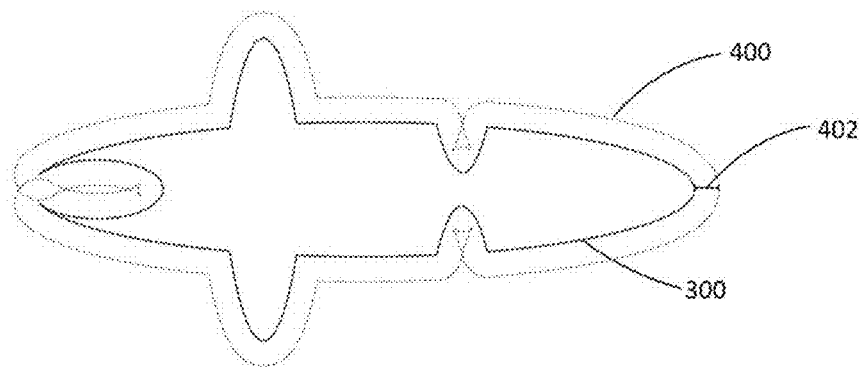
FIG. 4 illustrates offset boundary curve sections for positive offset distance.
Figure 5:
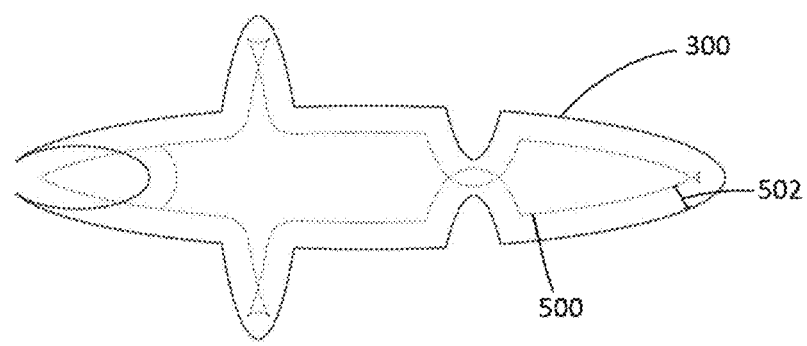
FIG. 5 illustrates offset boundary curve sections for negative offset distance.

FIG. 3 depicts another example boundary curve 300 problematic curves sections. FIG. 4 illustrates an offset boundary curve 400 with a positive offset distance D 402 from the example boundary curve 300 of FIG. 3. Further, FIG. 5 illustrates an offset boundary curve 500 with a negative offset distance D 502 from the example boundary curve 300 of FIG. 3. Various intersections and overlaps of the offset curves 400, 500 are illustrated.

As seen in FIGS. 1B and 2, the offset boundary curves 110, 202a, 202b may intersect each other or each may intersect itself. Here, the term $\tau_i$ denotes the parameter values on the offset curve $\bar{c}$ corresponding to the points whereat each of the offset curve(s) 110, 202a, 202b intersects with itself or with one of the other offset curves 110, 202a, 202b or to the vertices where an end point of the offset curve 110, 202a, 202b coincides with an end point of another offset curve. If the list of $\tau_i$ is sorted in ascending order and $\tau<\tau'$ are two consecutive parameter values in the sorted list, then the section $\bar{c}(\tau, \tau')$ of the offset boundary curve $\bar{c}$ is defined as $$\bar{c}(\tau,\tau')=\{\bar{r}(t)=(\bar{x}(t),\bar{y}(t)), t_1\leq\tau\leq t\leq\tau'\leq t_2\} \quad (16).$$

The first and the last point of the offset curve section are defined to be $\bar{r}(\tau)$ and $\bar{r}(\tau')$, respectively, if $o(\bar{c})=+1$, or vice versa if $o(\bar{c})=-1$.

A node is defined as a set of all end points of offset curve sections within minimum node distance $\mu$. More precisely, each intersection point r is assigned a node n(r) such that $$|r_1-r_2|\leq\mu \Leftrightarrow n(r_1)=n(r_2) \quad (17).$$

Therefore, if the distance between two intersection points $r_1$ and $r_m$ is larger than $\mu$, such points may still belong to the same node by transitivity if there are other intersection points $r_i$ such that $$|r_i-r_{i+1}|<\mu, i=1,\ldots,m-1 \quad (18).$$

A pair of offset boundary curve sections $\bar{c}_k(\tau_1, \tau_2)$ and $\bar{c}_l(\tau'_1, \tau'_2)$ are defined to be connected at node n if both the last point $\bar{r}_k(t_L(\bar{c}_k(\tau_1, \tau_2)))$ of the first section and the first point $\bar{r}_l(t_F(\bar{c}_l(\tau'_1, \tau'_2)))$ of the second section belong to node n $$n(\bar{r}_k(t_L(\bar{c}_k(\tau_1,\tau_2))))=n(\bar{r}_l(t_F(\bar{c}_l(T'_1,T'_2))))=n \quad (19).$$

An offset boundary curve section can be connected to itself, if the offset boundary curve 110, 202a, 202b forms a loop such that the first and last points thereof belong to the same node.

Offset boundary curve section $\bar{c}_l(\tau'_1, \tau'_2)$ is defined to be tangential to $\bar{c}_k(\tau_1, \tau_2)$ at node n if the first points of both offset boundary curve sections belong to node n $$n(\bar{r}_k(t_F(\bar{c}_k(\tau_1,\tau_2))))=n(\bar{r}_l(t_F(\bar{c}_l(\tau_1',\tau_2'))))=n \quad (20),$$

or if the last points of both offset boundary curve sections belong to node n $$n(\bar{r}_k(t_L(\bar{c}_k(\tau_1,\tau_2))))=n(\bar{r}_l(t_L(\bar{c}_l(\tau_1',\tau_2'))))=n \quad (21)$$

and the tangents of both offset boundary curve sections at the end points $E\in\{F,L\}$ belonging to node n have the same direction:

$$\angle(T(\bar{r}_k(t_E(\bar{c}_k(\tau_1,\tau_2)))),T(\bar{r}_l(t_E(\bar{c}_l(\tau_1',\tau_2')))))=0 \quad (22).$$

Curve section $\bar{c}_l(\tau'_1, \tau'_2)$ is defined to be a successor of curve section $\bar{c}_k(\tau_1, \tau_2)$ $$\bar{c}_l(\tau_1',\tau_2')=\sigma(\bar{c}_k(\tau_1,\tau_2))) \quad (23)$$

with respect to the sign parameter S that depends on the sign of the offset distance D $$S = \begin{cases} +1, \text{ when } D > 0 \\ -1, \text{ when } D < 0 \end{cases} \quad (24)$$

if:

$\bar{c}_l(\tau'_1, \tau'_2)$ and $\bar{c}_k(\tau_1, \tau_2)$) are connected at node n;

if there are other curve sections tangential to $\bar{c}_k(\tau_1, \tau_2)$, then among those other curve sections the signed curvature $S_\kappa(\bar{r}_k(t_L(\bar{c}_k(\tau_1, \tau_2))))$ takes the minimum value;

if there are other curve sections tangential to $\bar{c}_l(\tau'_1, \tau'_2)$ at node n, then among the other curve sections the signed curvature $S_\kappa(\bar{r}_l(t_F(\bar{c}_l(\tau'_1, \tau'_2))))$ takes the minimum value; and the signed angle between the curve tangents at node n $$S\angle(T(\bar{r}_k(t_L(\bar{c}_k(\tau_1,\tau_2)))), T(\bar{r}_l(t_F(\bar{c}_l(\tau_1',\tau_2'))))) \quad (25)$$

takes the minimum value among all pairs of connected curve sections at node n.

Figure 6:
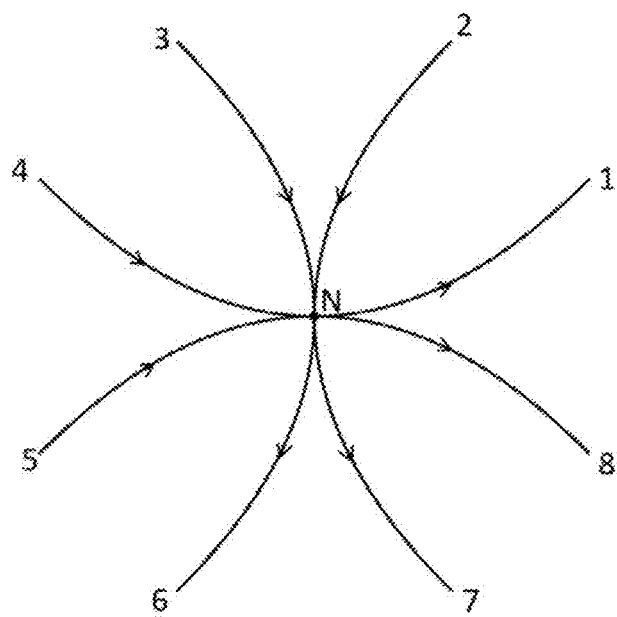
FIG. 6 illustrates the finding of successors on multiple curve sections, according to example embodiments.

Referring now to FIG. 6, it is possible for a curve section to be its own successor. FIG. 6 shows the finding of the successors on an example of eight curve sections enumerated from 1 to 8 that all share the same node N at one endpoint thereof, respectively. Arrows indicate the curve directions from the first to the last point on each curve section. The pairs of curve sections (2,3), (4,5), (6,7) and (8,1) are pairwise tangential. For S=1, the curvature at the node N is minimum for curve sections 3, 5, 6 and 8. Of these, four pairs (3,6), (3,8), (5,6), (5,8) are connected. Among the connected pairs, the pair (5,6) has the minimum angle between the curve tangents at node N. Therefore, 6 is the successor of 5, 6=σ(5). For S=−1, the curvature at the node N is maximum for curve sections 2, 4, 7 and 1. Also, four pairs (2,7), (2,1), (4,7), (4,1) are connected. Among these connected pairs, the pair (2,1) has the minimum angle between the curve tangents at node N. Therefore, 1 is the successor of 2, 1=σ(2).

Offset boundary $\bar{b}$ is defined as a list of sections of curves from the offset boundary curve set $\bar{B}'$ forming a boundary:

$$\bar{b} = \{\bar{c}_1(r_1, r'_1), \ldots, \bar{c}_i(\tau_i, \tau'_i), \ldots, \bar{c}_N(\tau_N, \tau'_N)\} \quad (26)$$

$\bar{r}_i(t_L(\bar{c}_i)) = r_{i+1}(t_F(\bar{c}_{i+1})) \; i = 1, \ldots, N-1$ $\bar{r}_N(t_L(\bar{c}_N)) = \bar{r}_1(t_F(\bar{c}_1))$ with the additional condition that in the list order each offset boundary curve section is followed by its successor $\bar{r}_{i+1}(t_F(\bar{c}_{i+1})) = \sigma(\bar{r}_i(t_L(\bar{c}_i))) \; i = 1, \ldots, N-1$ $\bar{r}_1(t_F(\bar{c}_1)) = \sigma(\bar{r}_N(t_L(\bar{c}_N)))$.

Each offset boundary $\bar{b}$ encloses a simply connected planar region which we denote by $\bar{R}$, i.e. $\bar{b}=B(\bar{R})$. In general, the set of all offset boundaries $\bar{b}=B(\bar{R})$ resulting by offsetting a boundary set $B=\{B(R)\}$ is also a boundary set, which is referred to as an offset boundary set and denoted by $\bar{B}$:

$$\bar{B}=\{B(\bar{R})\} \quad (27).$$

Figure 7:
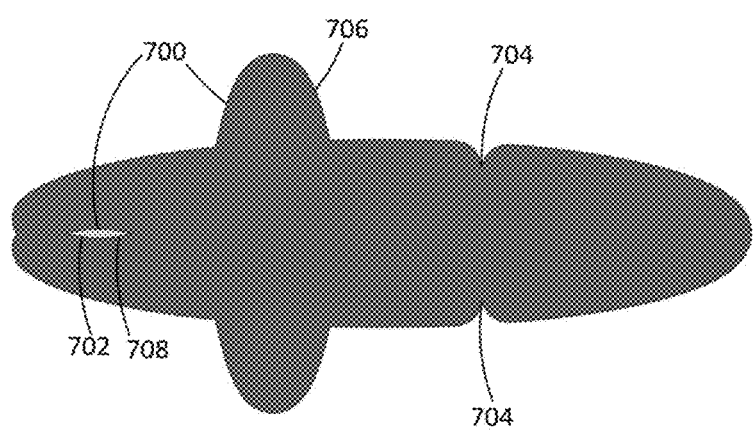
FIG. 7 illustrates offset boundaries of a boundary curve for positive offset distance with a smaller offset boundary inside a larger one has negative area and represents a hole.

FIG. 7 shows the set of offset boundaries 700 of the boundary 300 from FIG. 3 for a positive offset distance D. The set of offset boundaries 700 comprises two boundaries, one large boundary 706 with positive area and one smaller offset boundary 708 inside the large offset boundary 706. The smaller offset boundary 708 has negative, in which case the smaller offset boundary 708 represents a hole 702, as illustrated in FIG. 7. Each cusp section 704 is by itself also part of the offset boundary 700. Such cusp offset boundaries 704 may be removed from the offset boundary set. However, the cusp offset boundaries 704 may also be kept as an indicator of the sections of the original boundary curves 300 (FIG. 3) whereat curvature κ(t)<−1/D.

Figure 8:
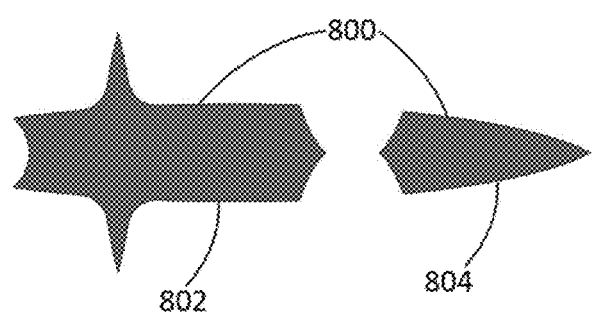
FIG. 8 illustrates offset boundaries of the boundary curve for negative offset distance.

FIG. 8 illustrates another set of offset boundaries 800 for the boundary 300 from FIG. 3. The set of offset boundaries 800 shown in FIG. 8 are for a negative offset distance D. The negative offset boundaries 800 comprise two disjunct boundaries 802, 804 with positive areas.

Offsetting may further be used for smoothing an offset boundary to a target maximum absolute value of the curvature. The boundary can be smoothened in two independent steps.

A first smoothing step comprises convex smoothing of the boundary to the target maximum curvature $\kappa_{convex}$. The convex smoothing is performed by offsetting the boundary by $D=-1/\kappa_{convex}$, followed by the offseting of the resulting boundary by $D=1/\kappa_{convex}$. As a result, any convex vertex points are replaced by circular arcs with curvature $\kappa_{convex}$ and the curvature κ of the curves of the smoothened boundary is always $\kappa<\kappa_{convex}$.

A second smoothing step comprises concave smoothing of the boundary to the target minimum curvature $-\kappa_{concave}$. The concave smoothing is performed by offsetting the boundary by $D=1/\kappa_{concave}$, followed by the offseting of the resulting boundary by $D=-1/\kappa_{concave}$. As a result, any concave vertex points are replaced by circular arcs with curvature $-\kappa_{concave}$ and the curvature κ of the curves of the smoothened boundary is always $\kappa \geq \kappa_{concave}$.

In the first and second smoothing steps, the values of $\kappa_{convex}$ and $\kappa_{concave}$ need not be the same. Boundary merging and splitting may also be performed. Boundary merging and splitting may comprise a component of offsetting and/or boundary smoothing. Offsetting may be used for merging the offset boundaries closer to one another than the target minimum distance $D_{min}$ and for splitting the boundaries narrower than the target minimum width $W_{min}$.

The boundaries are merged in two steps:

Offset the boundaries in the input boundary set by $D=D_{min}/2$

Offset the boundaries resulting from the previous step by $D=-D_{min}/2$.

The boundaries are split in two steps:

Offset the boundaries in the input boundary set by $D=-W_{min}/2$

Offset the boundaries resulting from the previous step by $D=W_{min}/2$.

In the following, a system/method is detailed for finding the offset boundary set $\bar{B}$ for a given input boundary set B. Inputs to the method comprise:

The number of boundaries M in the input boundary set $B=\{b_m\}$

The number of boundary curves $N_m$ in each boundary $b_m \in B$

The list of $N_m$ boundary curves $c_{m1}, \ldots, c_{mN_m}$ for each boundary $b_m \in B$ The offset distance D The minimum distance μ under which two curve intersections are considered to belong to the same node.

Initially, creating the set of offset boundary curves $\bar{b}'m$ for each $b_m \in B$ comprises:

Offset each curve $c_{mi}$ and add the resulting offset curve $\bar{c}_{mi}$ to $\bar{b}'_m$ Find all pairs of boundary curves $c_{mi}$, $c_{mj}$ with $j=i+1$ or $i=N_m$ and $j=1$ and calculate the angle $$\Delta\varphi_{mij} = P\angle(T(r_{mi}(t_{mi2}),T(r_{mj}(t_{mj1})) \quad (29)$$

Create vertex point $c_m d$ for each $\Delta\varphi_{mij} > 0$ when $D>0$, or for each $\Delta\varphi_{mij} < 0$ when $D<0$.

Offset each vertex point $c_{mij}$ and add the resulting offset vertex point $\bar{c}_{mij}$ to $\bar{b}'_m$ Next, all intersections $\bar{r}_i(\tau) = \bar{r}_j(\tau')$ between all pairs of offset boundary curves $(\bar{c}_i, \bar{c}_j)$, where $i,j=1, \ldots, N$ and $i<j$ are found, and each intersection point is denoted by $I(i,\tau,j,\tau')$.

In a next step, each intersection point $I(i,\tau,j,\tau')$ is assigned a node $n(i,\tau,j,\tau')$ such that two intersection points within distance p are assigned to the same node:

$$|\bar{r}_i(\tau) - \bar{r}_k(\bar{\tau})| \leq \mu \Leftrightarrow n(i,\tau,j,\tau') = n(k,\bar{\tau},l,\bar{\tau}') \quad (30)$$

Then, for each offset curve $\bar{c}_k$, find all sections between the intersection points:

Create the list of all intersection points $I(i,\tau,j,\tau')$ with $i=k$

Sort the list by the values of parameter $\tau$ in increasing order for each adjacent pair of intersections $(k,\tau_1,j_1,\tau'_1)$ and $(k,\tau_2,j_2,\tau'_2)$ in the sorted list, create the section $(\bar{c}_k(\tau_1,\tau_2),n_1,n_2)$, where $\bar{c}_k(\tau_1,\tau_2)$ is the section of the curve $\bar{c}_k$ between parameter values $\tau_1$ and $\tau_2$ and $n_1 = n(k, t_F(\bar{c}_k(\tau_1,\tau_2)),j_1, \tau'_1)$ and $n_2 = n(k, t_L(\bar{c}_k(\tau_1,\tau_2)), j_2, \tau'_2)$ are the nodes of the intersections at the first and the last point of the section $\bar{c}_k(\tau_1,\tau_2)$, respectively.

For a next step, identify and remove cusp sections with coinciding first and last points $\bar{r}(\tau) = \bar{r}(\tau')$ for which at least one $t \in [\tau,\tau']$ exists such that the curvature $\kappa(t)$ of the original curve c and the curvature $\bar{\kappa}(t)$ of the offset curve $\bar{c}$ have opposite signs.

According to another step, find section successors:

Define $S = D/|D|$

Find all pairs of connected sections $s = (\bar{c}_k(\tau_1,\tau_2), n_1, n_2)$ and $s' = (\bar{c}_k(\tau'_1, \tau'_2), n'_1, n'_2)$ such that $n_2 = n'_1$ For each pair of connected sections $(s,s')$, find the angle between the curve tangents at the connecting node $n = n_2 = n'_1$ $$\alpha(s,s',n) = \angle(T(\bar{r}_k(t_L(\bar{c}_k(\tau_1,\tau_2)))),T(\bar{r}_l(t_F(\bar{c}_l(\tau_1',\tau_2'))))) \quad (31)$$

For each pair of connected sections $(s,s')$, find signed curvatures of the curves at the connecting node $n = n_2 = n'_1$ $$\kappa(s,n) = S_\kappa(\bar{r}_k(t_L(\bar{c}_k(\tau_1,\tau_2)))) \quad (32)$$

$$\kappa(s',n) = S_\kappa(\bar{r}_l(t_F(\bar{c}_l(\tau_1',\tau_2')))) \quad (33)$$

Ignore all pairs of connected sections $(s,s')$ for which $|\alpha(s,s',n)| = \pi$ For each node n, find the pair of connected sections $(s_m, s'_m)$ for which $S\alpha(s_m, s'_m, n)$ is minimum From all such pairs for a given node n, find the one for which $\kappa(s_m,n)$ and $\kappa(s'_m,n)$ are minimum Define $s'_m$ as the successor section of $s_m$, i.e. $s'_m = \sigma(s_m)$.

Then, find all offset boundaries formed by sections:

Create a list $\Sigma$ of sections s for which the successor $\sigma(s)$ has been defined Mark each section s from $\Sigma$ as not yet visited.

For each section s from $\Sigma$:
  i. Skip s if it has already been visited.
  ii. Otherwise, create a new offset boundary $\bar{b}$ and assign $s' \leftarrow s$
  iii. Add s' to the offset boundary $\bar{b}$ and mark s' as visited.
  iv. Assign $s' \leftarrow \sigma(s')$
  v. If $s' \neq s$, proceed with step iii
  vi. Otherwise, if $s' = s$, add offset boundary $\bar{b}$ to the resulting offset boundary set $\bar{B}$ and proceed with step i Calculate area $A(\bar{b})$ of each offset boundary $\bar{b}$ and mark those with $A(\bar{b}) < 0$ as holes The following illustrates detailed examples of the subject technology. Here, the inputs may be provided as:

offset distance D the number M of boundaries in the input boundary set $\{b_m\}$ array $N[1, \ldots, M]$ of the numbers of curves $N[m]$ in each boundary $b_m$ from the input boundary set arrays $x[m=1, \ldots, M][1, \ldots, N[m]]$ and $y[m=1, \ldots, M][1, \ldots, N[m]]$ of symbolic expressions representing curve functions arrays $t_1[m=1, \ldots, M][1, \ldots, N[m]]$ and $t_2[m=1, \ldots, M][1, \ldots, N[m]]$ of parameter interval bounds array $o[m=1, \ldots, M][1, \ldots, N[m]]$ of curve orientations with the possible values $\pm 1$ function CURVE-INTERSECTIONS$(x, y, t_1, t_2, N, \eta, \lambda)$ to return the list of all intersections between the curves, where the arguments are arrays of symbolic expressions x, y representing curve functions arrays of parameter interval bounds $t_1$, $t_2$ the total number of curves N initial discretization tolerance $\epsilon$ reduction factor for the discretization tolerance $\eta$ precision $\lambda$ by which the intersection points are determined where the result is a list of intersections with components intersection.curve1, intersection.curve2 representing the array indices of the two intersecting curves, object.t1 and object.t2 representing the corresponding parameter values on the two curves at the intersection, and object.point representing the intersection point.

Function to obtain the numerical value of the symbolic expression e for parameter value t is EVALUATE(e,t) and to get the symbolic expression representing the derivative of the symbolic expression e is DERIVE(e).

Minimum distance $\mu$ between the intersection points in the same node.

Based on the provided inputs, symbolic expression evaluation and derivation may be determined. Here, the parametric functions describing the curves are given symbolically in form of an expression tree. In such a tree, which may be created by parsing the string representation of the function, each expression node object node represents an expression with, but not limited to, the following information:

Expression type node.type, which may be one of: NUMBER, PARAMETER, SUM, DIFFERENCE, PRODUCT, QUOTIENT, MINUS, POWER, SQRT, LOG, EXP, SIN, COS, TAN, ARCTAN For expression type number, the numerical value node.number.

For expression type power, the integer power node.power.

For unary expression types, the first argument node.first, which is a pointer to another expression node object representing the first argument subexpression.

For binary expression types, the second argument node.second, which is a pointer to another expression node object representing the second argument subexpression.

Further, availability of the functions may create the following:
expression node of type NUMBER, node←NUMBER (value)
expression node of type PARAMETER, node←PARAMETER
expression node of type POWER, node←POWER (power)
expression nodes of unary type
  node←MINUS(first)
  node←LOG(first)
  node←EXP(first)
  node←SIN(first)
  node←cos(first)
  node←TAN(first)
  node←ARCTAN(first)
  node←MINUS(first)
expression node of binary type
  node←SUM(first, second)
  node←DIFFERENCE(first, second)
  node←PRODUCT(first, second)
  node←QUOTIENT(first, second)
  node←POWER(first, second)
Then, for example, the expression tree for the function $$\frac{1}{5\sqrt{8\arctan(1)}} e^{-\frac{1}{2}\left(\frac{t-2}{5}\right)^2} \tag{36}$$

with the string representation 1/(5*sqrt (8*arctan (1)))*exp (−1/2*((t−2)/5)^2) may be created by the following code sequence:
  one←NUMBER(1)
  two←NUMBER(2)
  five←NUMBER(5)
  eight←NUMBER(8)
  t←PARAMETER
  n1←DIFFERENCE(t, two)
  n2←QUOTIENT(n1, five)
  n3←POWER(n2, 2)
  n4←QUOTIENT(one, two)
  n5←MINUS(n4)
  n6←PRODUCT(n5, n3)
  n7←EXP(n6)
  n8←ARCTAN(one)
  n9←PRODUCT(eight, n8)
  n10←SQRT(n9)
  n11←PRODUCT(five, n10)
  n12←QUOTIENT(one, n11)
  f←PRODUCT(n12n7).

The subject technology may use the following function to evaluate the expression given by the top-most node e of the expression tree for the parameter value t:
  function EVALUATE(e, t)
  if e.type=NUMBER then
    return e.number
  else if e.type=PARAMETER then
    return t
  else if e.type=SUM then
    return EVALUATE(e.first, t)+EVALUATE(e.second, t)
  else if e.type=DIFFERENCE then
    return EVALUATE(e.first, t)−EVALUATE(e.second, t)
  else if e.type=PRODUCT then
    return EVALUATE(e.first, t)×EVALUATE(e.second, t)
  else if e.type=QUOTIENT then
    return EVALUATE(e.first, t)/EVALUATE(e.second, t)
  else if e.type=MINUS then
    return−EVALUATE(e.first)
  else if e.type=POWER then
    r←1
    v←EVALUATE(e.first)
    for i←1, e.power do
      r←rv
    end for
    return r
  else if e.type=SQRT then
    return $\sqrt{\text{EVALUATE(e.first)}}$
  else if e.type=log then
    return log(EVALUATE(e.first))
  else if e.type=EXP then
    return exp(EVALUATE(e.first))
  else if e.type=SIN then
    return sin(EVALUATE(e.first))
  else if e.type=COS then
    return cos(EVALUATE(e.first))
  else if e.type=TAN then
    return tan(EVALUATE(e.first))
  else if e.type=ARCTAN then
    return arctan(EVALUATE(e.first))
  end if
  end function.

The subject technology may use the following function to determine the expression given by the top-most node e of the expression tree and return and return a new expression tree representing the derivative expression:
  function DERIVE(e)
  if e.type=NUMBER then
    return NUMBER(O)
  else if e.type=PARAMETER then
    return NUMBER(1)
  else if e.type=SUM then
    return SUM(DERIVE(e.first, t) DERIVE(e.second))
  else if e.type=DIFFERENCE then
    return DIFFERENCE (DERIVE(e.first, t) DERIVE(e.second))
  else if e.type=PRODUCT then
    e1←PRODUCT(DERIVE(e.first), e.second)
    e2←PRODUCT(e.first, DERIVE(e.second))
    return SUM(e1, e2)
  else if e.type=QUOTIENT then
    e1←PRODUCT(DERIVE(e.first), e.second)
    e2←PRODUCT(e.first, DERIVE(e.second))
    e3←DIFFERENCE(e1, e2)
    return QUOTIENT(e.3, POWER(e.second, 2))
  else if e.type=MINUS then
    return MINUS(DERIVE(e.first))
  else if e.type=POWER then
    e1←POWER(e.first, NUMBER(e.power−1))
    e2←PRODUCT(NUMBER(e.power), e1)
    return PRODUCT(DERIVE(e.first), e2)
  else if e.type=SQRT then
    e1←QUOTIENT(DERIVE(e.first), SQRT(e.first))
    return QUOTIENT (e1, NUMBER(2))
  else if e.type=LOG then
    return QUOTIENT(DERIVE(e.first), e.first))
  else if e.type=EXP then
    return PRODUCT(DERIVE(e.first), EXP(e.first))
  else if e.type=SIN then
    return PRODUCT(DERIVE(e.first), COS(e.first))
  else if e.type=COS then
    return MINUS(PRODUCT(DERIVE(e.first), SIN (e.first))
  else if e.type=TAN then return QUOTIENT(DERIVE(e.first), POWER(COS(e.first), 2))
    else if e.type=ARCTAN then
      return QUOTIENT(DERIVE(e.first), SUM(NUMBER(1), POWER(e.first), 2)))
    end if
end function.

Section endpoint parameter values may be determined by the subject technology. Here, the following two functions may return the parameter value for the first and the last point of the curve section $c_k(\tau_1, \tau_2)$, respectively, depending on its orientation. The argument section is assumed to be an object with components section.t1, section.t2 and section.o containing the parameter values $\tau_1$, $\tau_2$ and the curve orientation o(c):

function FIRST(section)
    if section.o>0 then
      return section.t1
    else
      return section.t2
    end if
end function
function LAST(section)
    if section.o>0 then
      return section.t2
    else
      return section.t1
    end if
end function.

The subject technology may determine tangent vectors. The following function calculates the tangent vector of the curve section at parameter value t with the orientation depending on the curve orientation. The argument section is assumed to be an object with components section.x, section.y containing the symbolic expressions to calculate the points and the derivatives of the curve and section.o containing the orientation of the curve section:

function TANGENT(section, t)
    tangent.x←section.o×EVALUATE(Section.x[1], t)
    tangent.y←section.o×EVALUATE(section.y[1], t)
    n←$\sqrt{tangent.x^2 + tangent.y^2}$
    tangent.x←tangent.x/n
    tangent.x←tangent.y/n
    return t
end function.

A calculation of curvature may be performed by the subject technology. The following function calculates the signed curvature of the curve section at parameter value t depending on the curve orientation. The argument section is assumed to be an object with components section.x, section.y containing the symbolic expressions to calculate the points and the derivatives of the curve and section.o containing the orientation of the curve section:

function CURVATURE(section, t)
    x'←section.o×EVALUATE(section.x[1], t)
    y'←section.o×EVALUATE(section.y[1], t)
    x"←section.o×EVALUATE(section.x[2], t)
    y"←section.o×EVALUATE(section.y[2], t)
    return←section.o×$((x'y''-y'x'')/((x')^2+(y')^2)^{3/2})$
end function.

The subject technology may determine an angle and a principal angle between vectors. The following two functions return the angle $0 \leq \alpha < 2\pi$ and the principal value of the angle $-\pi < P\alpha \leq \pi$ between the vectors v1 and v2 given as objects with components v1.x, v1.y, v2.x, v2.y containing their coordinates:

function PRINCIPAL-ANGLE(v1, v2)
    $n_1$←v1.x×v1.x+v1.y×v1.y
    $n_2$←v2.x×v2.x+v2.y×v2.y
    c←(v1.x×v2.x+v1.y×v2.y)/($n_1 n_2$)
    s←(v1.x×v2.y←v1.y×v2.x)/($n_1 n_2$)
    return SIGN(s)×arccos(c)
end function
function ANGLE(v1, v2)
    p←PRINCIPAL-ANGLE(v1, v2)
    if p<0 then
      return p+$27\pi$
    else
      return p
    end if
end function.

Computing a boundary area may be provided by the subject technology. The following function computes the area of the boundary given by the arrays of symbolic expressions x, y representing curve functions, arrays of parameter interval bounds $t_1$, $t_2$, array of curve orientations o and the number of curves K:

function AREA(x, y, $t_1$, $t_2$, o, K, $\epsilon$, M)
    j←1
    for k←1, K do
      $\tau$[k]←DISCRETIZATION(x[k], y[k], $t_1$[k], $t_2$[k], M, $\epsilon$, $\beta$)
      n←LENGTH($\tau$[k])
      for i'←1, n do
        if o[k]>0 then
          i←i'
        else
          i←n+1−i'
        end if
        x[j]←EVALUATE(x[k], $\tau$[k][i])
        y[j]←(y[k], $\tau$[k][i])
        j←j+1
      end for
      j←j−1
    end for
    a←0
    for i←1, j−1 do
      a←a+(x[i]y[i+1]−y[i]x[i+1])/2
    end for
    return a
end function.

The subject technology may determine offset boundary curves. The following function derives offset boundary curves and offset vertex points for the boundary given by arrays of symbolic expressions x, y representing curve functions, arrays of parameter interval bounds $t_1$, $t_2$, array of curve orientations o, the number of curves N and the offset distance D:

function OFFSET-CURVES(x, y, $t_1$, $t_2$, o, N, D)
    for i←1, N do
      c[i].x[0]←x[i]
      c[i].y[O]←y[i]
      c[i].x[1]←DERIVE(x[i])
      c[i].y[l]←DERIVE(y[i])
      c[i].t1←t1[i]
      c[i].t2←t2[i]
      c[i].o←o[i]
    end for
    curves←EMPTY-LIST
    j←1
    for i←1, N do
      dx←DERIVE(x[i])
      dy←DERIVE(y[i])

```
dn←SQRT(SUM(POWER(dx, 2), POWER(dy, 2)))
curve.x←SUM(x[i], PRODUCT(NUMBER(D), QUO-
   TIENT(dy, dn)))
curve.y←DIFFERENCE(y[i], PRODUCT(NUMBER
   (D), QUOTIENT(dx, dn)))
curve.t1←t₁[i]
curve.t2←t₂[i]
curve.o←o[i]
curve.i←i
APPEND(curves, curve)
j←MOD(i+1, N+1)
tangent1←TANGENT(C[i], LAST(c[i]))
tangent2←TANGENT(C[j], FIRST(c[j]))
pa←PRINCIPAL-ANGLE(tangent1, tangent2)
if pa>O∧D>O∨pa<O∧D<0 then
   xaxis.x←1
   xaxis.y←0
   a←ANGLExaxis, tangent1−π/2
   da←−ANGLE(tangent1, tangent2)−
   vx←NUMBER(EVALUATE(x[i], LAST(c[i]))
   vy←NUMBER(EVALUATE(y[i], LAST(c[i]))
   dvx←PRODUCT(NUMBER(D),   COS(PARAM-
      ETER))
   dvy←PRODUCT(NUMBER(D),   SIN(PARAM-
      ETER))
   curve.x←SUM(vx, dvx)
   curve.y←SUM(vy, dvy)
   curve.t1←MIN(a, a+da)
   curve.t2←MAX(a, a+da)
   curve.o←D/|D|
   curve.i←0
   APPEND(curves, curve)
   end if
end for
return curves
end function.
```

The result is a list of objects of type curve' with components curve.x and curve.y containing symbolic expressions representing offset boundary curve functions, curve.t1 and curve.t2 containing parameter interval bounds of the offset boundary curve, curve.o containing its orientation, and curve.i containing the index of the original curve from which the offset curve has been derived within the input arrays, or 0 if the curve has been derived from the vertex point.

The subject technology may also provide for determining nodes. For example, the following function will return an associative table of node assignments for all intersections which are given as a list, intersections, of objects i with the component i.point comprising the intersection point. The nodes are assigned to the intersection points by finding the transitive closure of the relation (30):

```
function NODES(intersections, p)
j←1
for i ∈ intersections do
   intersection[j]←i
   equivallent[j]←j
   node[i]←0
   j←j+1
end for
N←j−1
for j←1, N do
   for k←j+1,N do
      dx←intersection[j].point.x−intersection[k].point.x
      dy←intersection[j].point.y−intersection[k].point.y
      if √(dx²+dy²)<μ then
         l←equivallent[j]
         equivallent[j]←k
         equivallent[k]←l
      end if
   end for
end for
n←1
for j←1, N do
   if node[intersection[j]]=0 then
      node[intersection[j]]←n
      k←equivallent[j]
      while k≠j do
         node[intersection[k]]←n
      end while
      n←n+1
   end if
end for
return node
end function.
```

The subject technology may also provide for determining curve sections. For example, the following function will find all intersections of the curves and return the list of all sections of curves between the intersections together with the information about the nodes at endpoints of each section. The inputs are the arrays x, y of functions to calculate the points and the derivatives of the curves, the arrays $t_1$, $t_2$ of lower and upper parameter values, the array o of the curve orientations, the number of curves N, the minimum distance μ between the intersections belonging to the same node, and the parameters $\in$, η, λ, $n_D$, β required by the function for finding the curve intersections. The output is a list of objects of type section with components section.x and section.y containing the arrays of symbolic expressions to calculate the points and the derivatives of the section, section.t1 and section.t2 containing the lower and the higher parameter values $\tau_1$ and $\tau_2$ of the curve section, section.o containing the orientation of the section, section.node1 and section.node2 containing the nodes at the first and the last point of the section, and section.i containing the index of the curve from which the curve section has been derived:

```
function SECTIONS (x, y, t1, t2, o, N, ∈, η, λ, nD, β,μ)
   intersections ←CURVE-INTERSECTIONS (x, y, t1, t2, o, N, ∈, η, λ,
nD, β,)
   for i ∈ intersections do
      i.point.x ← (EVALUATE(x[i. c1](i.t1) + EVALUATE(x[i.c2](i.t2))) /
2
      i.point.y ← (EVALUATE(y[i. c1](i.t1) + EVALUATE(y[i.c2](i.t2))) /
2
   end for
   node ← NODES(intersections,μ)
   sections ← EMPTY-LIST
   for k ← 1, N do
      for intersection ∈ intersections do
         I ← EMPTY-LIST
         if i.c1 = k then
            APPEND (I, intersection)
         end if
      end for
      n ← length(I)
      if n > 1 then
         I ← SORT(I, i1.t1 < i2.t1)
         i ← 1
         while i < n do
            j ← i + 1
            while j ≤ n ∧ node[I[i]] = node[I[j]] do
               j ← j + 1
            end while
            if j < n then
               section.x[0] ←x[k]
               section.y[0] ←y[k]
               for m ← 1, 2 do
```

```
            section.x[m] ← DERIVE(section.x[m – 1])
            section.y[m] ← DERIVE(section.y[m – 1])
          end for
          section.o ← o[k]
          section.i ← k
          section.t1 ← I[i].t1
          section.t2 ← I[j].t1
          if o(k) > 0 then
            section.node1 ← node[I[i]]
            section.node2 ← node[I[j]]
          else
            section.node1 ← node[I[j]]
            section.node2 ← node[I[i]]
          end if
          APPEND(sections, section)
        end if
        i ← j
      end while
    end if
  end for
  return sections
end function.
```

The following function removes from the list of those sections containing at least one discretized curve point $\tau_i$ for which curvature $\overline{\kappa}(\tau_i)D > 1$:

```
function REMOVE-CUSP-SECTIONS(sections, D)
  S ← EMPTY-LIST
  for s ∈ sections do
    cusp ← FALSE
    if s.node1 = s.node2 then
      τ ← DISCRETIZATION(s.x[0], s.y[0], s.t1, s.t2, M, ϵ, β)
      for i ← 1,LENGTH(τ) do
        if D × CURVATURE(section,τ[i]) > 1 then
          cusp ← TRUE
        end if
      end for
    end if
    if ¬cusp then
      APPEND(S, s)
    end if
  end for
  return S
end function.
```

The subject technology may also provide for determining section successors. For example, the function to find the successors of the sections may be defined. The arguments are the sign S and the list sections containing the objects of type section with components section.o containing the orientation of the section, section.node1 and section.node2 containing the nodes at the first and the last point of the section, section.x and section.y containing the functions to calculate the points and the derivatives of the section, and section.t1 and section.t2 containing the lower and the higher parameter values $\tau_1$ and $\tau_2$ of the curve section. The result is an associative table successor associating to each section its successor section successor[section]:

```
function SUCCESSORS(sections, S)
  for s ∈ sections do
    angle[s.node1] ← 2πS
    angle[s.node2] ← 2πS
  end for
  nodes ← EMPTY-LIST
  for s1 ∈ sections do
    for s2 ∈ sections do
      if s1.node2 = s2.node1 then
        node ← s1.node2
        if node ∉ nodes then
          APPEND(nodes, node)
        end if
        T_1 ← × TANGENT(s1, LAST(s1))
        T_2 ← × TANGENT(s1, FIRST(s1))
        C_1 ← S × CURVATURE(s1, LAST(s1))
        C_2 ← S × CURVATURE(s1, FIRST(s1))
        α ← S × ANGLE(T_1, T_2)
        if |α| ≠ π then
          if angle[node] = 2π ∨ α < angle[node] then
            angle[node] ← α
            section1[node] ← s1
            section2[node] ← s2
            tangent1[node] ← T_1
            tangent2[node] ← T_2
            curvature1[node] ← C_1
            curvature2[node] ← C_2
          else
            if α = angle[node] then
              α_1 ← ANGLE(T_1, tangent1[node])
              α_2 ← ANGLE(T_1, tangent1[node])
              if α_1 = ∧ C_1 < curvature1[node] then
                section1[node] ← s1
                curvature1[node] ← C_1
              end if
              if α_2 = 0 ∧ C_2 < curvature2[node] then
                section2[node] ← s2
                curvature2[node] ← C_2
              end if
            end if
          end if
        end if
      end if
    end for
  end for
  for node ∈ nodes do
    successor[section1[node]] ← section2[node]
  end for
  return successor
end function.
```

The subject technology may also provide for determining boundaries. For example, the following function finds all boundaries given a list of sections and the associative table successor associating to each section its successor section successor[section]. The result is a list of objects of type boundary, each of which is a list of objects of type section:

```
function BOUNDARIES(sections, successor)
  boundaries ← EMPTY-LIST
  for section ∈ sections do
    visited[section] ← FALSE
  end for
  for section ∈ sections do
    if ¬visited(section) then
      boundary EMPTY-LIST
      s ← section
    end if
    repeat
      visited[s] ← TRUE
      APPEND(boundary, s)
      s ← successor[s]
    until s = section
    if s ≠ section then
      APPEND(boundaries, boundary)
    end if
  end for
  return boundaries
end function.
```

The following function operates to offset the boundary set B by the offset distance D. The boundary set B is given by the number M of boundaries $b_m$ in B, the array N[1, . . . , M] of the numbers of curves in each $b_m$, the arrays of symbolic expressions representing curve functions x[m=1, . . . , M]

[1, ..., N[m]] and y[m=1, ..., M][1, ..., N[m]], the arrays t1$_1$[m=1, ..., M][1, ..., N[m]] and t1$_1$[m=1, ..., M][1, ..., N[m]] of the curve parameters and the array o$_1$[m=1, ..., M][1, ..., N[m]] of curve orientations.

The boundary set B is given by the number M of boundaries b$_m$ in B, the array N[1, ..., M] of the numbers of curves in each b$_m$, the arrays of symbolic expressions representing curve functions x[m=1, ..., M][1, ..., N[m]] and y[m=1, ..., M][1, ..., N[m]], the arrays t1$_1$[m=1, ..., M][1, ..., N[m]] and t1$_1$[m=1, ..., M][1, ..., N[m]] of the curve parameters and the array o$_1$[m=1, ..., M][1, ..., N[m]] of curve orientations.

The result is a list of objects of type boundary with components boundary.N containing the number of curves in the boundary, boundary.x, boundary.y containing the arrays of symbolic expressions representing curve functions, boundary.t1, boundary.t1 containing the arrays of parameter interval bounds, boundary.o containing the array of curve orientations, and boundary.area containing the area of the boundary.

```
function OFFSET(M, x, y, t₁, t₂, o, N, D)
  S←D/|D|
  j←1
  for m←1,M do
    C←OFFSET-CURVES(x[m], y[m], t₁[m], t₂[m], o[m], N[m], D)
    for c□C do
      x'[j]←c.x
      y'[j]←c.y
      t'₁[j]←c.t1
      t'₂[j]←c.t2
      o'[j]←c.o
      j←j+1
    end for
  end for
  N'←j-1
  sections←SECTIONS(x', y', t₁', t₂', o', N', ε, η, λ, n, μ)
  sections←REMOVE-CUSP-SECTIONS(sections, D)
  successor←SUCCESSORS(sections, S)
  boundaries←BOUNDARIES(sections, successor)
  B←EMPTY-LIST
  for boundary□boundaries do i←1
    for section□boundary do
      b.x[i]←section.x[O]
      b.y[i]←section.y[0]
      b.t1[i]←section.t1
      b.t2[i]←section.t2
      b.o[i]←section.o
      i←i+1
    end for
    b.N←i-1
    b.a←AREA (b.x, b.y, b.t1, b.t2, b.o, b.N, ε, n)
    APPEND(B, b)
  end for
  return B
end function.
```

Figure 9:
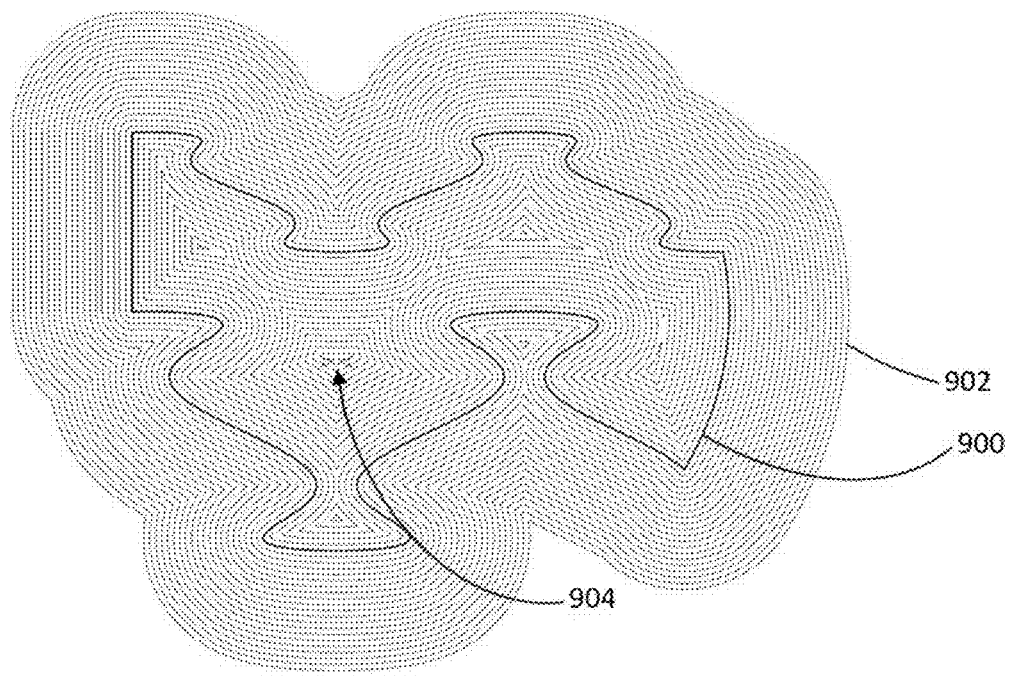
FIG. 9 illustrates a boundary defined by two sinusoidal curves, a line, and a circular arc and the offset boundaries thereof for twenty positive offset distances D=1, 2, . . . , 20 and 20 negative offset distances D=−1, −2, . . . , −20.

The method has been tested by offseting the boundary B given by four curves:

a line $x_1(t) = -50$ $y_1(t) = -t$ the first sinusoidal curve $x_2(t) = t + 8 \sin(0.4t)$ $y_2(t) = -20 + 20 \sin(0.1t)$ a circular arc $x_3(t) = 50 \cos(t)$ $y_3(t) = 50 \sin(t)$ the second sinusoidal curve $x_4(t) = -t - 4 \sin(0.4t)$ $y_4(t) = 20 - 10 \sin(0.1t)$ According to this example implementation, the orientation of all four curves is defined positively and the ranges of parameters are such that the curves form a boundary. In FIG. 9, the curved boundary B 900 is defined by two sinusoidal curves, a line, and a circular arc. The thick line illustrates the original boundary B 900 while relatively thinner lines illustrate offset boundaries 902. FIG. 9 shows the curved boundary B 900 and the offset boundaries of B 902 obtained for twenty positive offset distances D=1,2, ...,20 and twenty negative offset distances D=-1,-2, ...,-20.

Figure 10:
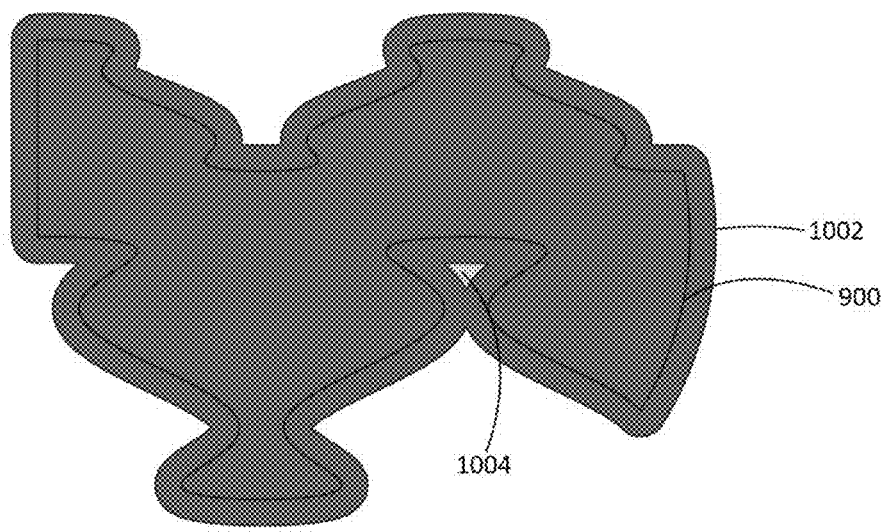
FIG. 10 illustrates the boundary of FIG. 9, shown by a thick line, and offset boundaries for the offset distance D=4.

FIG. 10 illustrates the offset boundaries of B for the offset distance D=4 of FIG. 9. It is apparent that the boundary offset curve 1002 of one sinusoidal curve intersected itself, creating a hole 1004 in the offset boundary curve 1002 for the boundary 900 of FIG. 9. It is notable that this self-intersection is due to the topology of the sinusoidal curve and not because the curvature of the offset curve thereof would fall below -1/D=-1/4.

Figure 11:
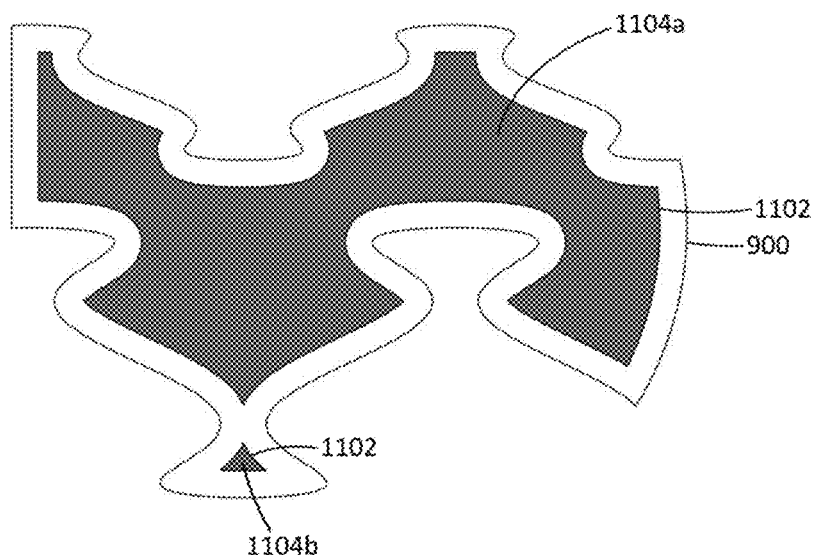
FIG. 11 illustrates the boundary of FIG. 9, shown by a thick line, and offset boundaries for the offset distance D=−4.

Referring now to FIG. 11, the offset boundaries of B for the offset distance D=-4 are illustrated. Here, FIG. 11 shows that the boundary offset curve 1102 of one sinusoidal curve intersected itself, creating two separate offset boundaries 1104a, 1104b. This self-intersection is due to the topology of the sinusoidal curve and not because the curvature of the offset curve thereof would exceed -1/D=1/4.

Figure 12:
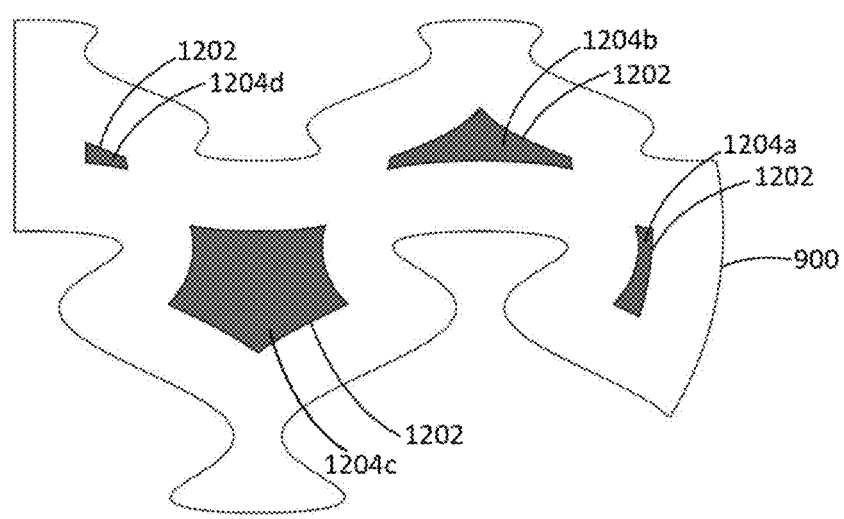
FIG. 12 illustrates the boundary of FIG. 9, shown by a thick line, and offset boundaries for the offset distance D=−10.

FIG. 12 shows the offset boundaries of B for the offset distance D=-10 of FIG. 9. As a result of multiple intersections and self-intersections of the boundary offset curve 1202, four separate offset boundaries are created 1204a, 1204b, 1204c, 1204d. Again, this self-intersection is due to the topology of the curve and not because the curvature would fall below -1/D.

Figure 13:
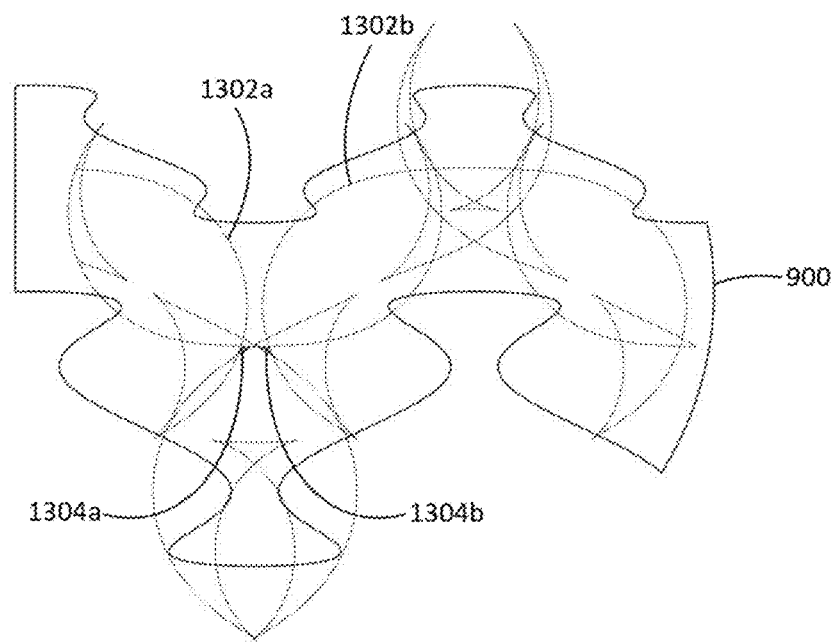
FIG. 13 illustrates the boundary of FIG. 9, shown by a thick line, and offset boundary curves for the offset distance D=−18, shown as thin lines, and two spurious offset boundaries shown as dark gray areas.

For complex boundary curve topologies and large offset distances, the topology of the offset boundary curves may become so complex that spurious offset boundaries emerge. An example of such spurious boundaries for D=-20 is shown in FIG. 9 where two offset boundaries each comprised of three curves emerge at the left offset boundary convergence point 904. Further, referring now to FIG. 13, a complex topology 1300 of the offset boundary curves of B for the offset distance D=-18 from the curved boundary 900 of FIG. 9. FIG. 13 shows that, due to the complex topology of the offset boundary curve intersections and self-intersections, two spurious offset boundaries 1302a, 1302b have been formed, shown as dark gray areas/regions 1304a, 1304b.

Figure 14:
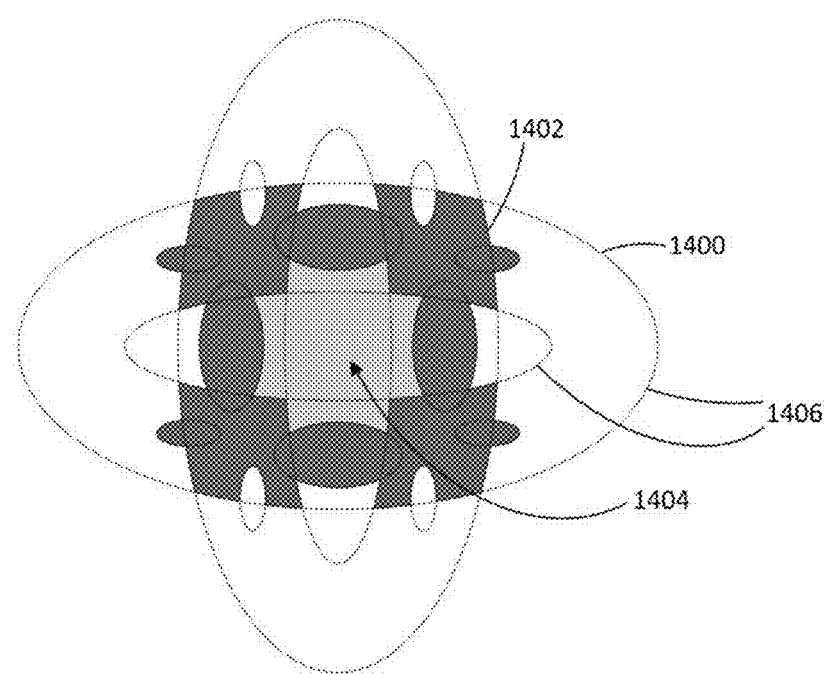
FIG. 14 illustrates another example boundary with a boundary hole before smoothing, created by successive application of Boolean operations on boundaries comprising elliptic arcs of different sizes, shown as curves.

FIG. 14 depicts an offset boundary 1402 with a hole 1404 before smoothing, created by successive application of Boolean operations on a curved boundary/boundaries 1400 comprising elliptic arcs 1406 of different sizes and shown as curves. FIG. 14 represents another example embodiment wherein a boundary has been smoothened to different target minimum and maximum curvature values. The original boundary 1400 before smoothing is shown as dark gray area surrounding the light gray hole 1404.

Figure 15:
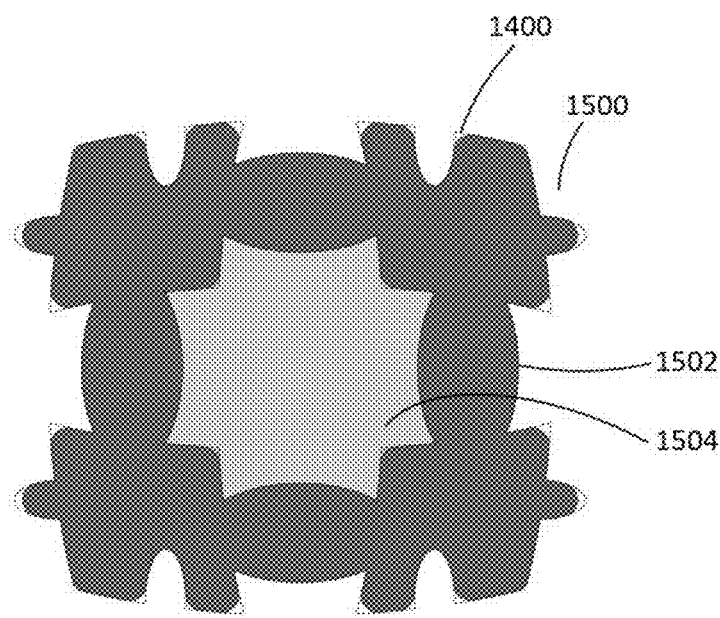
FIG. 15 illustrates an offset boundary with a light gray hole after convex smoothing.
Figure 16:
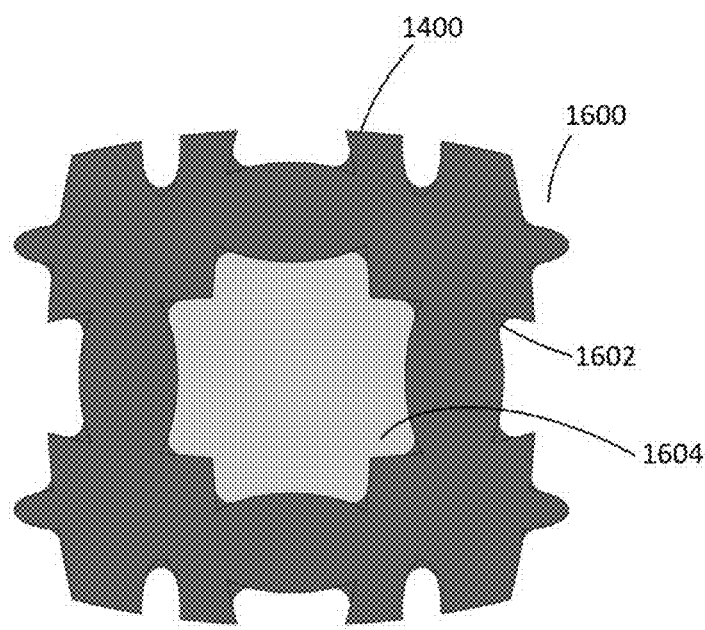
FIG. 16 illustrates an offset boundary with a light gray hole after concave smoothing.
Figure 17:
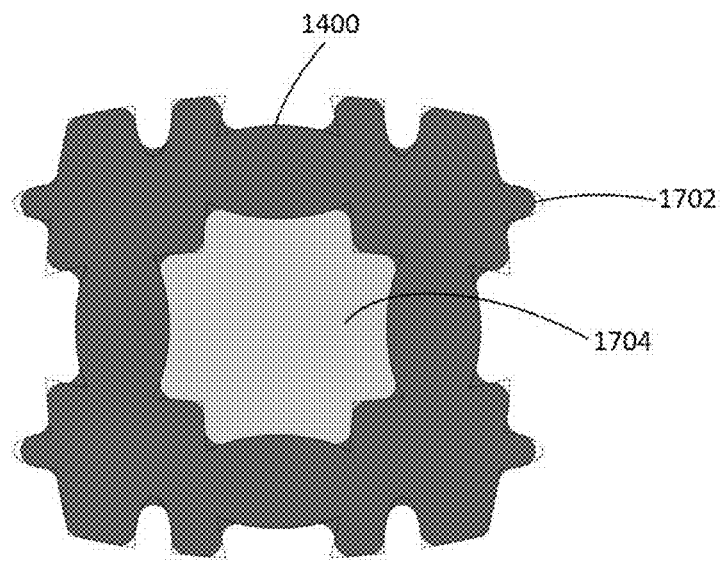
FIG. 17 illustrates an offset boundary with a light gray hole after convex and concave smoothing.

Referring now to FIGS. 15 and 16, offset boundary/boundaries 1502, 1602 and hole 1504, 1604 are shown after convex smoothing 1500 and after concave smoothing 1600, respectively, of the original boundary 1400 of FIG. 14. In FIG. 17, an offset boundary 1702 and hole 1704 are shown after the combination of the convex and concave smoothing 1500, 1600 as applied to the original boundary 1400.

Boundary merging and splitting may also be performed as a component of offsetting and smoothing. An example embodiment implements merging of boundaries that are closer to each other than the minimum distance and splitting of boundaries narrower than the minimum width.

Figure 18:
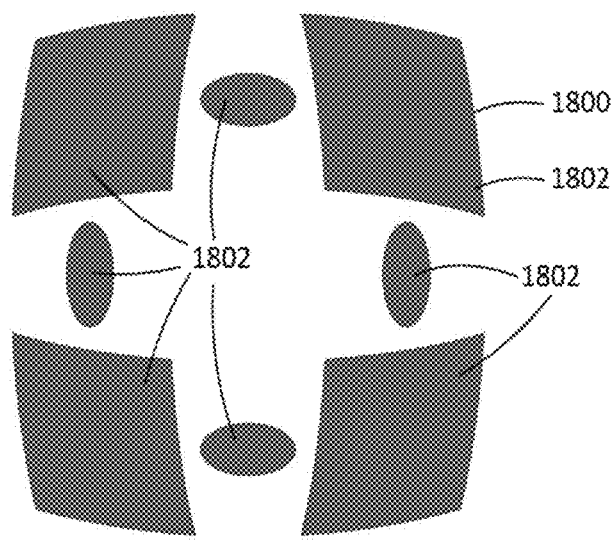
FIG. 18 illustrates a boundary set before merging.
Figure 19:
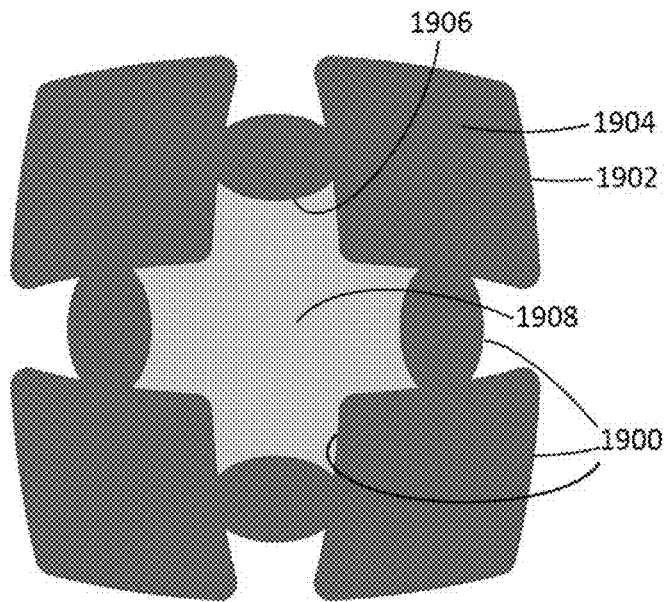
FIG. 19 illustrates a boundary set after offsetting by $D=D_{min}/2$.

This example embodiment is illustrated by FIG. 18 wherein the original boundary set 1800 (shown in FIG. 14) comprises eight boundaries, before merging, shown as dark gray areas 1802. FIG. 19 depicts an offset boundary 1900 resulting from offsetting the boundary set of FIG. 18 by $D=D_{min/2}$. Only two boundaries result, one dark gray boundary 1902 with a positive area 1904 and one light gray hole boundary 1906 with a negative area 1908 disposed therein.

Figure 20:
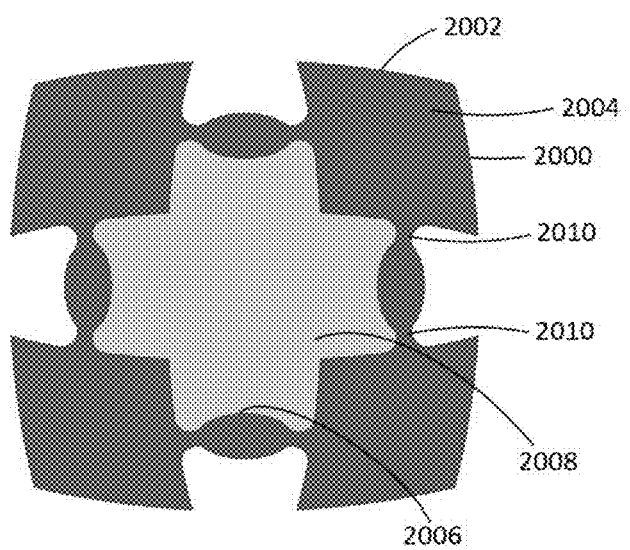
FIG. 20 illustrates a merged boundary set.

Referring now to FIG. 20 a merged boundary 2000 is shown after offsetting the boundary/boundaries 1900, 1904 of FIG. 19 by $D=-D_{min/2}$. The result again are only two boundaries, one dark gray boundary 2002 with a positive area 2004 and one light gray hole boundary 2006 with a negative area 2008 disposed therein. This merged boundary/boundaries 2000 comprises the same curves as the original boundary 1400, except for the missing curve sections that were within a distance less than $D_{min}$ from each other. Also, additional curve sections 2010 are inserted by the merging of the boundaries.

Figure 21:
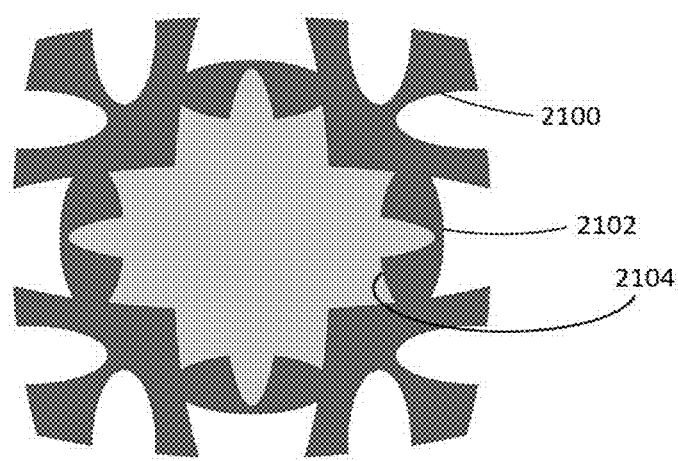
FIG. 21 illustrates a boundary set before splitting.
Figure 22:
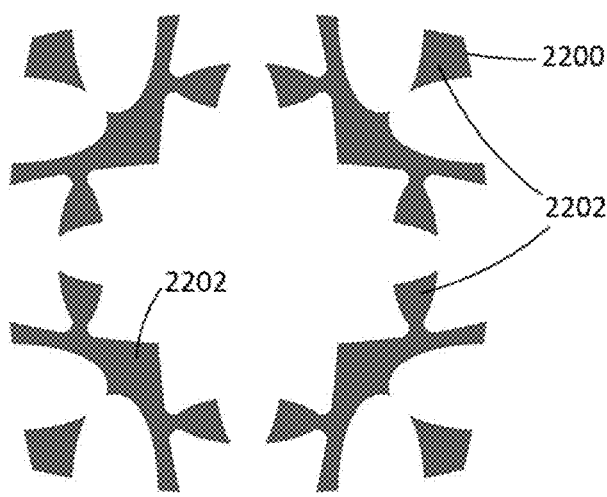
FIG. 22 illustrates a boundary set after splitting by $D=-W_{min}/2$.
Figure 23:
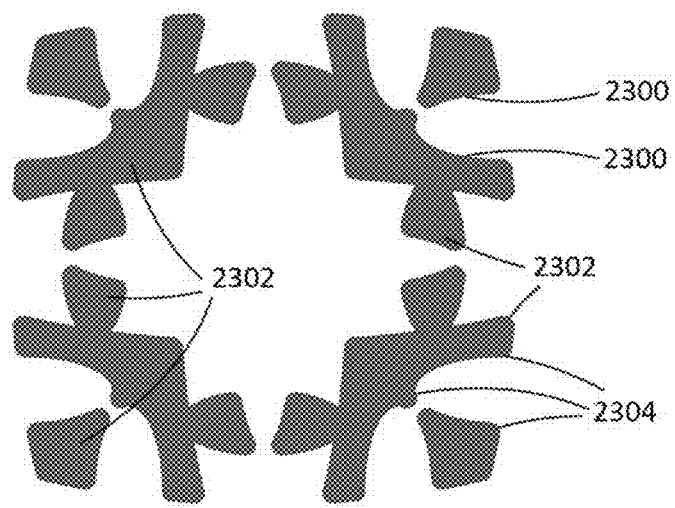
FIG. 23 illustrates a split and smoothed offset boundary.

FIG. 21 depicts the original boundary 2100 before splitting is shown with the positive area boundary 2102 as dark gray area and the negative area hole boundary 2104 contained inside as light gray area. FIG. 22 illustrates the boundary 2200 resulting from offsetting the boundary 2100 of FIG. 21 by $D=-W_{min/2}$. The result is eight dark gray boundaries 2202 with positive areas. Turning to FIG. 23 the final split boundary 2300 is shown after offsetting the boundary 2200 of FIG. 22 by $D=W_{min/2}$. The resulting boundary 2300 again includes eight boundaries 2302 consisting of the same curves as the original boundary 2100 (FIG. 21), except for the additional curve sections 2304 inserted by the splitting of the boundaries 2300, missing curve sections where the boundaries 2300 were narrower than $W_{min}$ and the additional curves inserted due to the smoothing of the boundaries 2300 to the target maximum convex curvature $x=1/W_{min/2}$.

As noted hereinabove, the present disclosure contemplates uses in (IC) design, computer aided design (CAD), computer aided manufacturing (CAM), lithographic mask generation, laser etching and engraving, electronic design automation (EDA), and other fabrication techniques.

Specifically, curve offsetting and boundary smoothing, as performed by the example system/method 100 may be applied to the physical fabrication of circuits components such that appropriated space is provided between curved boundaries of virtual and/or physical components. Aspects of the example system/method 100 include application of the offsetting and smoothing functions and equations described herein to the machining and/or fabrication of IC components and/or other electrical components developed using CAD software utilizing the example system/method 100.

The curve offsetting and smoothing of boundaries may also be displayed before fabrication and during the design process for integrated circuits or components designed with CAD software. As an engineer, and/or other user, designs integrated circuits and/or CAD components, such components are displayed on a computer display/output device 1316 (see FIG. 24). Throughout the design process, displayed components may be selected, moved, combined, added, etc. During manipulation of the displayed components, boundary curves and the distances therebetween may change. In response to, or simultaneous with, the changing of boundary curves the curve offsetting and curve smoothing of the example system/method 100 may be applied. Accordingly, the displayed boundary curves of manipulated components accurately reflects the offsetting and smoothing of the design component. This is an important improvement in the art because displaying the boundary curves with precision may improve the design process and allow for more efficient, compact, and accurate designs.

Still further, when an example design is produced according to the example system/method 100 of the present disclosure, often times the design is stored in a computer readable medium, such as memory. The design may be stored as one or more files, sometimes referred to as a design layout, readable by CAD software, viewer software, and/or machinery used for fabrication of a product/device/apparatus based on the design. As the curve offsetting and smoothing operations discussed herein are performed, the stored data/file(s) describing the design may be updated incrementally, in real or near-real time, and/or when a save operation is performed.

Figure 24:
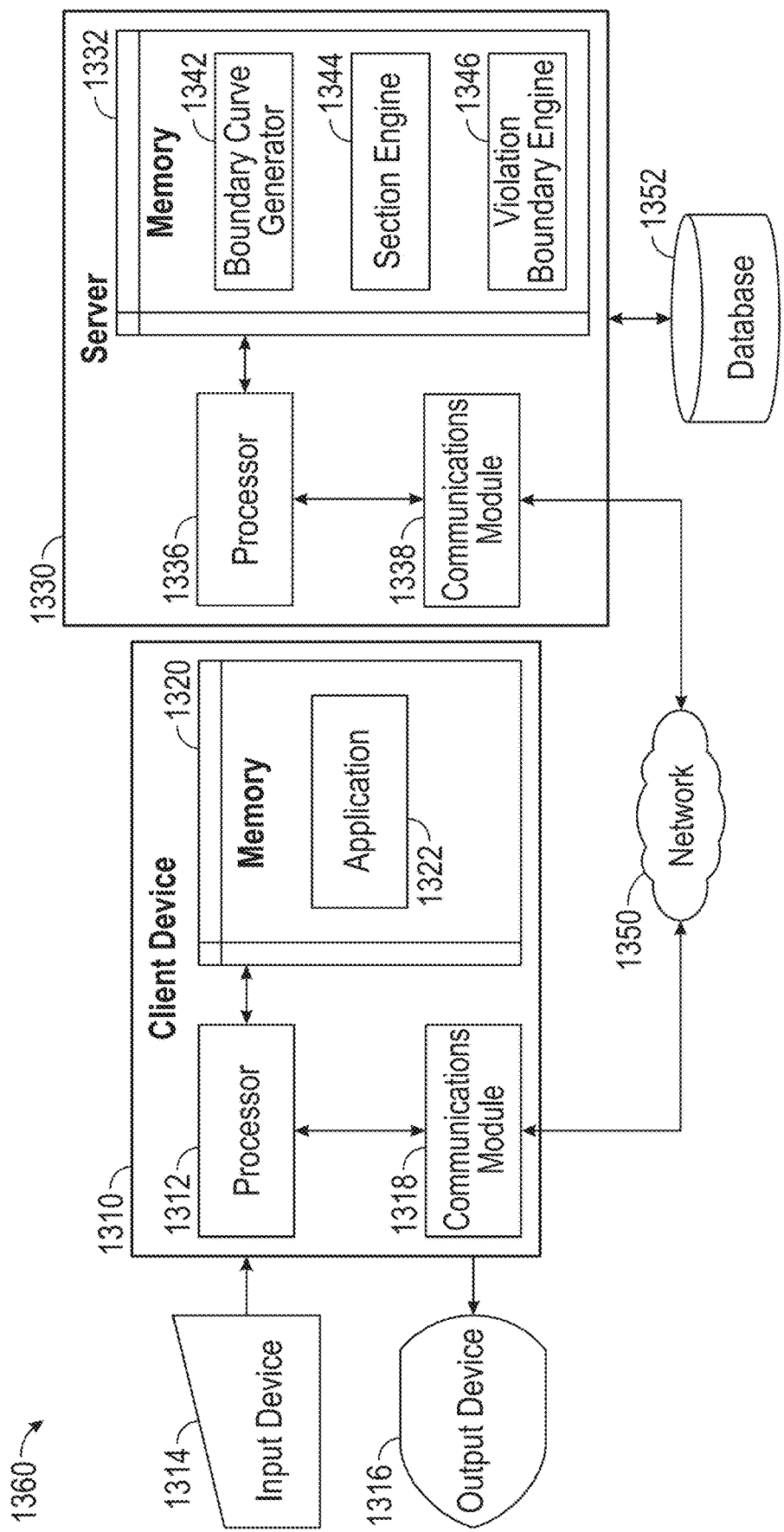
FIG. 24 illustrates an example architecture suitable for determining offset and smoothed boundaries in IC design or other suitable computer aided design, according to example embodiments.

FIG. 24 illustrates an example architecture 1360 suitable for determining offset curvature of planar region boundaries in an IC design and/or computer aided design, such as for fabricating a lithographic mask, according to example embodiments. A client device 1310 may include a processor 1312 and a communications module 1318 that enables client device 1310 to communicate with other devices via a network 1350. Client device 1310 also includes a memory 1320 for storing instructions which, when executed by processor 1312, cause client device 1310 to perform at least some of the steps in methods described herein. In some embodiments, the instructions stored in memory 1320 may include an application 1322 hosted by an external server (e.g., server 1330). In some embodiments, application 1322 is configured to perform Boolean operations, calculate offset curvature, and determine concave and convex smoothing for a computer aided design such as a high yield IC chip. Client device 1310 may also include such accessories as an input device 1314 (e.g., a mouse, a pointer, a keyboard, a touchscreen display, a camera, a speaker, and the like) and an output device 1316 (e.g., a display, a speaker, a camera, and the like).

Client device 1310 may be communicatively coupled with a server 1330 via a network 1350. Server 1330 may include a processor 1336 and a communications module 1338 to activate information exchanges through network 1350 (e.g., with client device 1310). Server 1330 may also include a memory 1332 coupled to processor 1336. Memory 1332 stores instructions which, when executed by processor 1336, cause server 1330 to perform at least some of the steps in methods described herein. In some embodiments, memory 1332 may include boundary curve generator 1342, a section engine 1344, and a boundary smoothing engine 1346. Server 1330 may include, or be communicatively coupled with, a database 1352. Database 1352 may include multiple IC configurations, boundary and section parameters/functions, libraries, and resources collected historically by server 1330 for previous computer aided designs and boundary analysis that may be helpful for the boundary curve generator 1342, the section engine 1344, and the boundary smoothing engine 1346 in solving for a current IC design.

In some embodiments, boundary curve generator 1342 is configured to create a set of offset boundary curves for each boundary curve in a given boundary set. In some embodiments, section engine 1344 is configured to determine all sections between intersection points of offset boundary curves, and to determine section successors for the determined sections. The boundary smoothing engine 1346 is configured to determine and provide for display all violation boundaries formed by the sections.

In some embodiments, a designer using application 1322 in client device 1310 may not have a direct interaction with, or knowledge of, the steps performed by any one of the boundary curve generator 1342, the section engine 1344, and/or the boundary smoothing engine 1346.

In some embodiments, application 1322 may be partially or completely self-contained within client device 1310, including a separate library containing boundary curve generator 1342, section engine 1344, or sample violation boundary engine 1346 in a database directly accessible by, or being part of memory 1320, in client device 1310. Accordingly, the user may perform some, or all, of the steps in methods consistent with the present disclosure without communicating with the external server through network 1350.

At least some of the steps performed according to the system/method may be performed by a computer having a processor executing commands stored in a memory of the computer.

Further, the system/method may include retrieving, editing, and/or storing files in a database that is part of, or is communicably coupled to, the computer. Methods contemplated by the present disclosure may include at least two or more steps performed overlapping in time and/or almost simultaneously.

In some embodiments, at least one or more of the steps may be performed in a cloud computing environment, wherein a computer may include servers, such as a master server and a slave server. Accordingly, at least some of the steps discussed herein may be performed in parallel in different processors, following separate computational threads. For example, each of the separate computational threads may be performed by at least one of the slave servers in each of multiple applications and processors dedicated to the specific computational thread.

Figure 25:
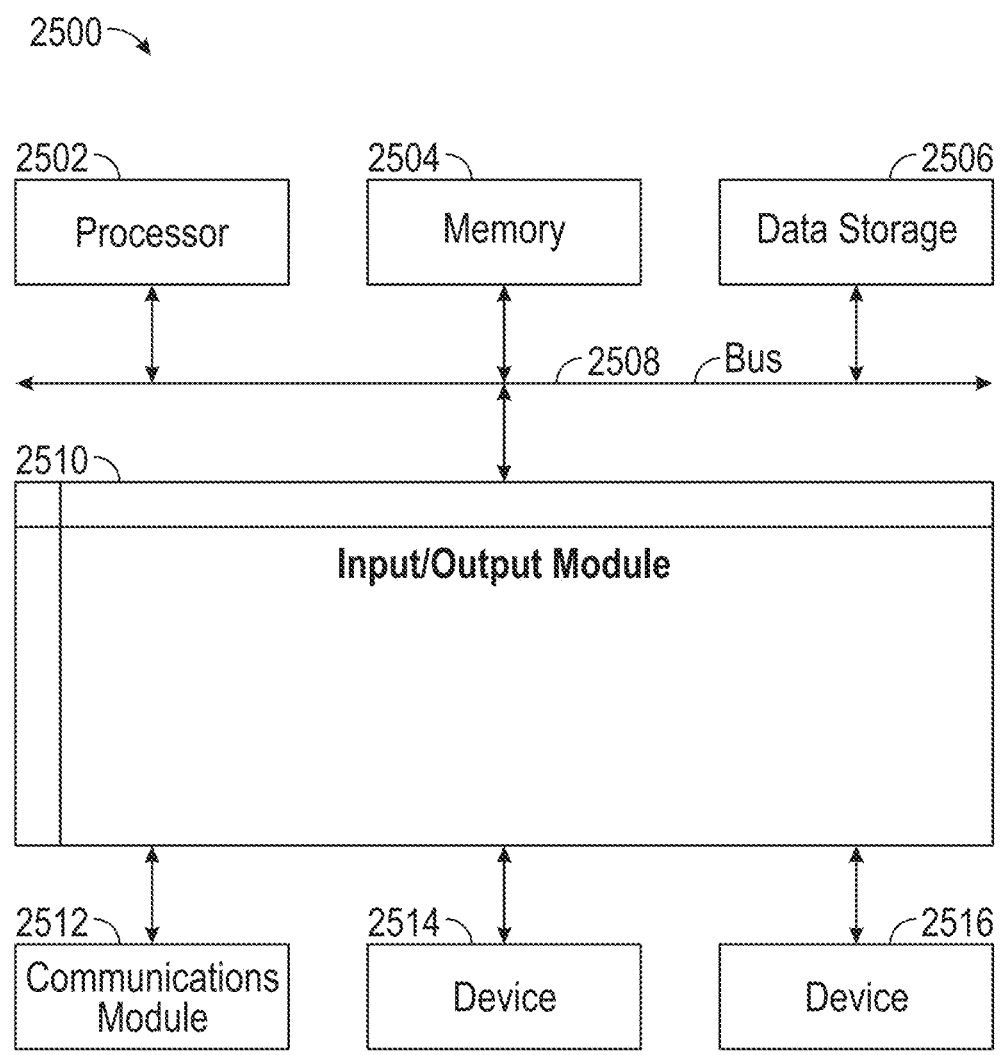
FIG. 25 is a block diagram illustrating an example computer system/architecture for execution of the system and/or method, according to example embodiments.

FIG. 25 is a block diagram illustrating an example computer system 2500 with which the system/method may be implemented, according to some embodiments. In certain aspects, computer system 2500 can be implemented using hardware or a combination of software and hardware, either in a dedicated server, integrated into another entity, or distributed across multiple entities.

Computer system 2500 includes a bus 2508 or other communication mechanism for communicating information, and a processor 2502 coupled with bus 2508 for processing information. By way of example, computer system 2500 can be implemented with one or more processors 2502. Processor 2502 can be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. In some embodiments, processor 2502 may include modules and circuits configured as a 'placing' tool or engine, or a 'routing' tool or engine, to place devices and route channels in a circuit layout, respectively and as disclosed herein.

Computer system 2500 includes, in addition to hardware, code that creates an execution environment for the computer program in question, e.g., code that constitutes processor firmware, a protocol stack, a database management system, an operating system, or a combination of one or more of them stored in an included memory 2504, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 2508 for storing information and instructions to be executed by processor 2502. Processor 2502 and memory 2504 can be supplemented by, or incorporated in, special purpose logic circuitry.

The instructions may be stored in memory 2504 and implemented in one or more computer program products, e.g., one or more modules of computer program instructions encoded on a computer readable medium for execution by, or to control the operation of, the computer system 2500, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis languages, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, Wirth languages, embeddable languages, and xml-based languages. Memory 2504 may also be used for storing temporary variable or other intermediate information during execution of instructions to be executed by processor 2502.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 2500 further includes a data storage device 2506 such as a magnetic disk or optical disk, coupled to bus 2508 for storing information and instructions. Computer system 2500 may be coupled via input/output module 2510 to various devices. The input/output module 2510 is any input/output module. Example input/output modules 2510 include data ports such as USB ports. The input/output module 2510 is configured to connect to a communications module 2512. Example communications modules 2512 include networking interface cards, such as Ethernet cards and modems. In certain aspects, the input/output module 2510 is configured to connect to a plurality of devices, such as an input device 2514 and/or an output device 2516. Example input devices 2514 include a keyboard and a pointing device, e.g., a mouse or a trackball, by which a user can provide input to the computer system 2500. Other kinds of input devices 2514 are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices 2516 include display devices, such as an LED (light emitting diode), CRT (cathode ray tube), or LCD (liquid crystal display) screen, for displaying information to the user.

Methods as disclosed herein may be performed by computer system 2500 in response to processor 2502 executing one or more sequences of one or more instructions contained in memory 2504. Such instructions may be read into memory 2504 from another machine-readable medium, such as data storage device 2506. Execution of the sequences of instructions contained in main memory 2504 causes processor 2502 to perform the process steps described herein (e.g., as in methods). One or more processors in a multi-processing arrangement may also be employed to execute the sequences of instructions contained in memory 2504. In alternative aspects, hard-wired circuitry may be used in place of, or in combination with, software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. The communication network can include, for example, any one or more of a personal area network (PAN), a local area network (LAN), a campus area network (CAN), a metropolitan area network (MAN), a wide area network (WAN), a broadband network (BBN), the Internet, and the like. Further, the communication network can include, but is not limited to, for example, any one or more of the following network topologies, including a bus network, a star network, a ring network, a mesh network, a star-bus network, tree or hierarchical network, or the like. The communications modules can be, for example, modems or Ethernet cards.

Computing system 2500 includes servers and personal computer devices. A personal computing device and server are generally remote from each other and typically interact through a communication network. The relationship of client and server arises by virtue of computer programs running on the respective computers and having a client-server relationship to each other. Computer system 2500 can be, for example, and without limitation, a desktop computer, laptop computer, or tablet computer. Computer system 2500 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer readable medium" as used herein refers to any medium or media that participates in providing instructions or data to processor 2502 for execution. Such a medium may take many forms, including, but not limited to, non-volatile media, volatile media, and transmission media. Non-volatile media include, for example, optical disks, magnetic disks, or flash memory, such as data storage device 2506. Volatile media include dynamic memory, such as memory 2504. Transmission media include coaxial cables, copper wire, and fiber optics, including the wires that include bus 2508. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

In one aspect, a method may be an operation, an instruction, or a function and vice versa. In one aspect, a clause or a claim may be amended to include some or all of the words (e.g., instructions, operations, functions, or components) recited in either one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software, or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

In one aspect, a term field effect transistor (FET) may refer to any of a variety of multi-terminal transistors generally operating on the principals of controlling an electric field to control the shape and hence the conductivity of a channel of one type of charge carrier in a semiconductor material, including, but not limited to, a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

To the extent that the term "include," "have," or "the like" is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A computer-implemented method of offsetting boundary curves, comprising:
  providing a plurality of inputs for an identified boundary set;
  developing an offset distance;
  creating an offset boundary curve for each boundary;
  determining intersection points of each of offset boundary curves;
  assigning a node to each of the intersection points;
  determining sections between the intersection points for the each of the offset boundary curves;
  determining a minimum distance between sections, wherein when the sections are nearer one another than the minimum distance, the sections are determined to belong to a same node; and
  combining the offset boundary curves to define a set of offset boundary curves.

2. The computer-implemented method of claim 1, wherein the plurality of inputs comprises:
a number of boundaries M in a boundary set $B=\{b_m\}$;
a number of boundary curves $N_m$ in each boundary $b_m \in B$;
a list of $N_m$ boundary curves $c_{m1}, \ldots, c_{mNm}$ for each boundary $b_m \in B$;
an offset distance; and
a minimum distance within which two curve intersections are considered to belong to the same node.

3. The computer-implemented method of claim 2, wherein the offset distance comprises one of a negative distance less than a target minimum offset width and a positive distance less than a target minimum offset distance.

4. The computer-implemented method of claim 3, further comprising:
smoothing the offset boundary curves.

5. The computer-implemented method of claim 4, wherein the smoothing of the offset boundary curves comprises boundary merging.

6. The computer-implemented method of claim 5, wherein the boundary merging comprises:
offsetting the boundaries of the identified boundary set by the positive distance less than the target minimum offset distance; and
offsetting the offset boundary curves by the negative distance less than the target minimum offset distance.

7. The computer-implemented method of claim 6, wherein the boundary merging creates multiple offset boundary curves that are closer to one another than the target minimum distance.

8. The computer-implemented method of claim 4, wherein the smoothing of the offset boundary curves comprises boundary splitting.

9. The computer-implemented method of claim 8, wherein the boundary splitting comprises:
offsetting the boundaries in the identified boundary set by the negative distance less than the target minimum offset width; and
offsetting the offset boundary curves by the positive distance less than the target minimum offset width.

10. The computer-implemented method of claim 9, wherein the boundary splitting creates multiple offset boundary curves that are narrower than the target minimum offset width.

11. A system, comprising:
a memory storing instructions; and
a processor configured to execute the instructions to cause the system to:
provide an identified boundary set comprising a plurality of boundary curves;
develop a target minimum offset distance;
develop a target minimum offset width;
create an offset boundary curve for each boundary curve of the plurality of boundary curves;
perform a smoothing operation on offset boundary curves; and
combine the offset boundary curves to define a set of offset boundary curves.

12. The system of claim 11, wherein the smoothing operation comprises at least one of a merging operation and a splitting operation.

13. The system of claim 12, wherein the merging operation comprises:
offsetting boundaries of the identified boundary set by a positive distance less than the target minimum offset distance; and
offsetting offset boundary curves by a negative distance less than the target minimum offset distance.

14. The system of claim 12, wherein the splitting operation comprises:
offsetting boundaries in the identified boundary set by a negative distance less than the target minimum offset width; and
offsetting the offset boundary curves by a positive distance less than the target minimum offset width.

15. The system of claim 12, wherein the identified boundary set is provided by computer aided design software.

16. The system of claim 15, wherein the set of offset boundary curves is provided to the computer aided design software.

17. A non-transitory machine-readable storage medium comprising machine-readable instructions for causing a processor to execute a method, the method comprising:
providing a plurality of inputs for an identified boundary set, the plurality of inputs comprising:
providing an identified boundary set comprising a plurality of boundary curves;
developing a target minimum offset distance;
developing a target minimum offset width;
creating an offset boundary curve for each boundary curve of the plurality of boundary curves;
smoothing offset boundary curves; and
combining the offset boundary curves to define a set of offset boundary curves.

18. The non-transitory machine-readable storage medium of claim 17, wherein the smoothing comprises at least one of a merging operation and a splitting operation.

19. The non-transitory machine-readable storage medium of claim 17, wherein the method comprises an executable component of computer aided design software.

20. The non-transitory machine-readable storage medium of claim 19, wherein the method is used by the computer aided design software to design one of a lithographic mask, an integrated circuit, and a photonic circuit.

* * * * *